United States Patent
Kanai et al.

(10) Patent No.: US 7,982,186 B2
(45) Date of Patent: Jul. 19, 2011

(54) METHOD AND APPARATUS FOR OBTAINING IMAGES BY RASTER SCANNING CHARGED PARTICLE BEAM OVER PATTERNED SUBSTRATE ON A CONTINUOUS MODE STAGE

(75) Inventors: Kenichi Kanai, Palo Alto, CA (US); Yan Zhao, San Jose, CA (US)

(73) Assignee: Hermes Microvision, Inc., Hsin-Chu (TW)

( * ) Notice: Subject to any disclaimer, the term of this patent is extended or adjusted under 35 U.S.C. 154(b) by 287 days.

(21) Appl. No.: 12/416,047

(22) Filed: Mar. 31, 2009

(65) Prior Publication Data
US 2009/0244078 A1 Oct. 1, 2009

Related U.S. Application Data

(60) Provisional application No. 61/041,344, filed on Apr. 1, 2008.

(51) Int. Cl.
*G21K 7/00* (2006.01)
(52) U.S. Cl. .......................... 250/306; 250/307; 250/310
(58) Field of Classification Search .................. 250/306, 250/307, 310
See application file for complete search history.

(56) References Cited

U.S. PATENT DOCUMENTS 7,154,674 B2 * 12/2006 Nellissen ...................... 359/619

* cited by examiner

*Primary Examiner* — Kiet T Nguyen
(74) *Attorney, Agent, or Firm* — Stout, Uxa, Buyan & Mullins, LLP

(57) ABSTRACT

A method of raster scanning a sample on a continuously moving stage for charged-particle beam imaging said sample is disclosed. The method includes line scanning a charged-particle beam across a surface of the sample repeatedly to form on the surface at least one 2-dimensional line array composed of scan lines lying adjacent to each other. When each line scan is to be performed, the charged-particle beam is shifted, along the stage-moving direction, by an extra pre-defined distance at least equal to a distance the stage has traveled during a time period from the beginning of the first line scan of the first formed line array to the beginning of the current line scan (to be performed) of the current line array (to be formed).

20 Claims, 20 Drawing Sheets

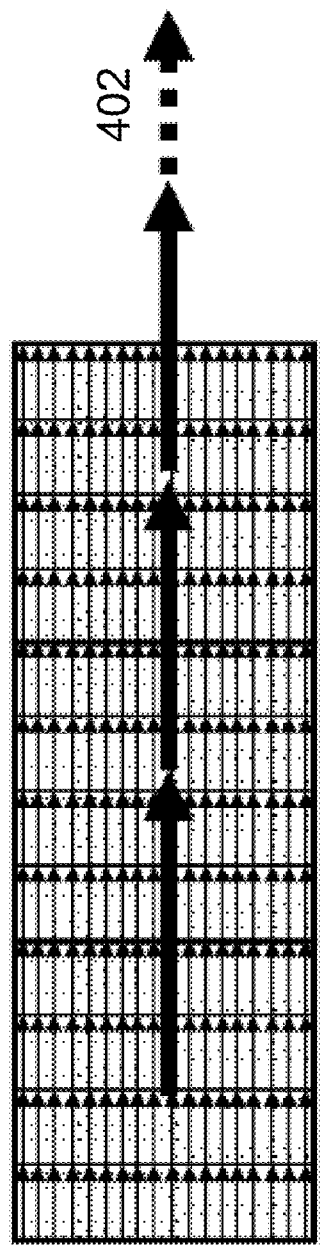
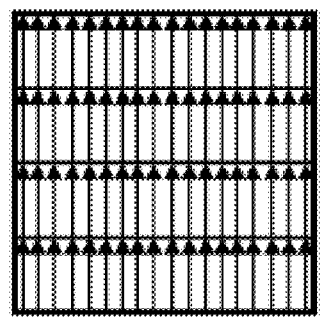
Fig.4(b) (Prior Art)

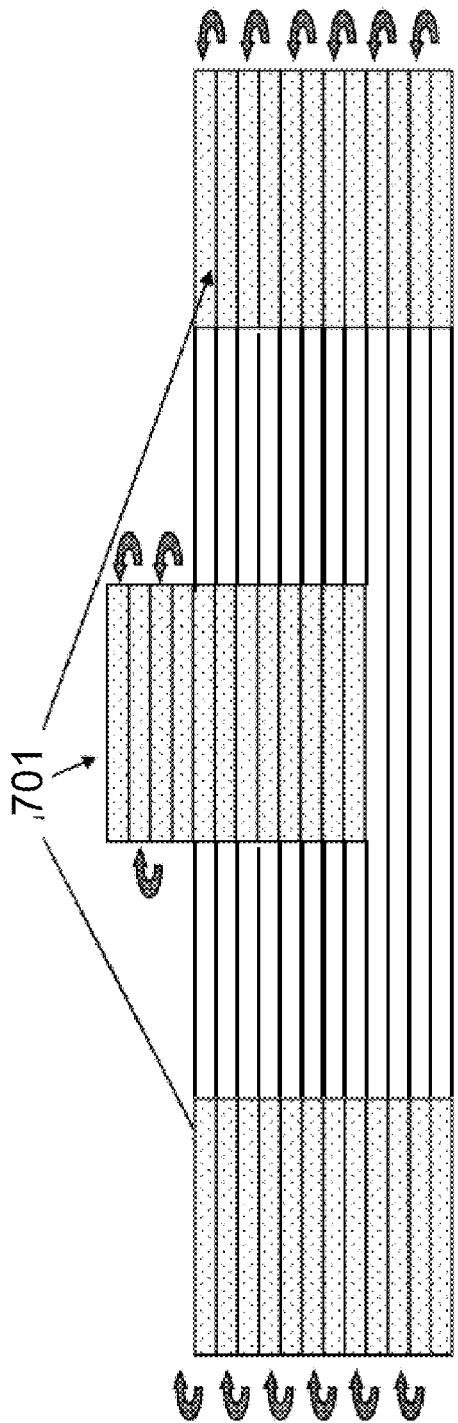 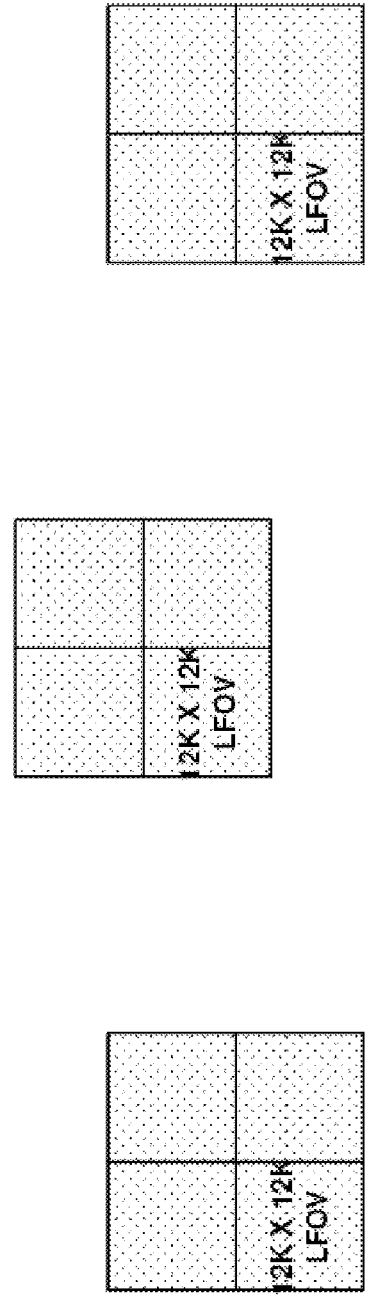
Fig. 7 (Prior Art)

METHOD AND APPARATUS FOR OBTAINING IMAGES BY RASTER SCANNING CHARGED PARTICLE BEAM OVER PATTERNED SUBSTRATE ON A CONTINUOUS MODE STAGE

CROSS-REFERENCE TO RELATED APPLICATIONS

This application claims the benefit of U.S. Provisional Application No. 61/041,344, filed Apr. 1, 2008 and entitled METHOD AND APPARATUS FOR OBTAINING IMAGES BY RASTER SCANNING E-BEAM OVER PATTERNED WAFER ON A CONTINUE MODE STAGE, the entire contents of which are incorporated herein by reference.

BACKGROUND OF THE INVENTION

1. Field of the Invention

The present invention relates generally to an apparatus and method to obtain an image of a patterned substrate, and more particularly to an apparatus and method to raster scan a charged-particle beam over a patterned substrate on a continuously moving stage.

2. Description of Related Art

The traditional charged-particle beam imaging system, such as a Scanning Electron Microscope (SEM), generates images by raster scanning a primary charged-particle beam such as an electron beam (e-beam) over a sample held on a stationary stage. Referring to the drawings, FIG. 1 illustrates a charged-particle beam microscope 100 according to the prior art. A primary charged-particle beam is generated from a charged-particle beam source 110 which may be, such as an electron beam gun. The primary charged-particle beam is condensed by a condenser lens module 120 and focused by an objective lens module 130 to form a charged-particle beam probe 140. A deflection unit 150 scans the charged-particle beam probe 140 in lines across the surface of a sample 195 on a sample stage 190. It is noted that the one dimensional line scan call be converted to a two dimensional raster by offsetting the beam center, or by moving the stage 190 properly in an orientation perpendicular to the line-scan direction. After the bombardment of the charged-particle beam probe 140 on the sample 195, secondary charged particles 160, such as secondary electrons, are emitted from the sample 195 and, along with the backscattered charged particles, such as backscattered electrons, are collected by a charged-particle detector 170. Since the amount of secondary charged particles is modulated by surface topography or voltage of the scanned area, a two dimensional image representing the topography contrast or voltage contrast is obtained. The sample 195 may be a patterned substrate such as a wafer, a lithography mask or a semiconductor device and so on, or any combination thereof.

FIG. 2(a) illustrates a raster-scan operation in accordance with traditional prior-art principles. As shown, the raster scanning is performed by repeating line scans N times with each line advancing in a direction perpendicular to the line-scan direction. FIG. 2(b) illustrates the formation of an image of a raster-scanned substrate in accordance with the traditional art. Secondary and/or backscattered electrons are collected by a detector or detectors. Detector output signal is sampled at even timing intervals during the line scan, yielding a line matrix 201 of M pixels. Combining line pixel matrixes for all line scans forms a 2-dimensional pixel matrix 202, called a frame, wherein a frame represents the image of the raster-scanned area of the substrate being imaged. It is noted that the size of an image is referenced as a Field of View, or FOV, hereinafter.

In an actual raster scan, after reaching the last pixel of a line, the primary charged-particle beam traverses back to the starting point of the next line. The extra time required/spent for this fly-back is called line overhead. For simplicity of explanation, a line scan is represented only by the effective line scan in the following figures, but the line scan time or line scan repetition period actually (e.g., preferably) will be measured from the beginning of one line scan to the beginning of the next line scan within one frame, which by default includes the fly-back time or overhead time. Fly back time also exists in repeating frames. Frame time or raster-scan repetition period is measured from the beginning of one frame to the beginning of a next repeating frame, which by default includes the fly-back time or overhead time.

In order to improve the quality of the image, two types of image averaging methods, Line Averaging and Frame Averaging, are often employed.

Line Averaging is performed by repeating the line scan multiple times at the same position before advancing to the next line, thereby acquiring P matrixes of pixels for each image line. Averaging the line matrixes, pixel by pixel, yields an averaged line matrix. Combining all averaged line matrixes forms a line-averaged image of 2-dimensional pixel arrays.

Frame Averaging is performed by repeating the identical raster scan a designated number of times, S, with the stage held at a stationary position. This process generates S sets of 2-dimensional pixel matrixes. Averaging these matrixes, pixel by pixel, forms a single image of 2-dimensional pixel matrix, which is a frame-averaged image. Frame averaging can be applied to line-averaged frames.

A charged-particle beam inspection system based on scanning electron microscope (EB Inspector) typically acquires inspection images in either of two image acquisition modes, one known as "Step-and-Repeat" mode and the other known as "Continuous-Scan" mode.

For an inspection to be performed, a user specifies the certain areas on the pattern of the substrate (i.e., wafer or mask) to be scan-imaged. These areas are called Areas of Interest (AOI). The EB inspector acquires electron beam images covering an AOI and processes the images to identify abnormalities of the patterns or alien objects on the pattern.

In Step-and-Repeat mode, a series of images is acquired in a sequential manner. FIG. 3 illustrates Step-and-Repeat mode imaging covering an AOI on a substrate in accordance with the traditional art. Taking each image 301, the stage whereupon the substrate is secured for imaging is moved along a stage stepping direction so that the center of the imaging area of the pattern is brought to the center of electron optical axis (a small error or offset is usually tolerable and managed by the system). As a result, the imaging action of interested areas is stepped as required, for example, as illustrated by arrow 302. When the movement is settled, such that, for example, the stage is at/in a stationary position, the charged-particle beam is raster-scanned over the imaging area. A 2-dimensional array of pixel data representing the image of the scanned area thus can be obtained. The stage then steps forward to the next stationary position. This type of process is repeated until a desired AOI 303 is covered. The image averaging methods, Line Averaging and Frame averaging, are often employed to improve the image quality to achieve the required inspection sensitivity.

Throughput of the inspection available for the system operating in Step-and-Repeat mode is largely limited by the image FOV and stage stepping time. Image FOV determines the total number of stage steps required for covering a given AOI, while stage stepping time depends mainly on the stepping distance and tolerable position error. Stage stepping time is purely an overhead time and generally falls into the range between 0.1 to 0.5 seconds. It is important to reduce the number of steps and stage stepping time.

A relatively recent EB Inspector, which operates in Step-and-Repeat as the default image acquisition mode, addressed this throughput issue by introducing an electron optics design to achieve Large Field of View (LFOV). FIG. 4(a) illustrates a Step-and-Repeat mode using LFOV to improve the throughput in accordance with the traditional art. If the LFOV is L times larger than a normal FOV, the number of stage steps required to cover the given AOI will be reduced by a factor of $L^2$. As shown, with other settings kept the same as in FIG. 3, image 401 is acquired using an FOV three times larger in size than that used for image 301. That is, if image 301 is of a size of single FOV, then image 401 is of a size of 3 FOV. The imaging action again steps as required, as illustrated by arrow 402. As a result, it can be seen in FIG. 4(a) that, by using LFOV image 401, only three stage steps are required to cover the same AOI 303. As compared to the greater number of stage steps needed in FIG. 3 using LOV image 301, the throughput of the embodiment of FIG. 4(a) would appear to offer improvement.

In practice, a LFOV is divided into multiple sub-FOV fields for beneficial low noise and high speed raster scanning. While each sub-field is imaged with traditional raster scanning, a relatively low frequency step signal, which is synchronized with sub-field frame rate, is superimposed onto the raster-scan signal for positioning or stitching each sub-field sequentially. FIG. 4(b) illustrates a Step-and-Repeat mode raster-scan imaging operation using a LFOV with multiple sub-fields in accordance with the traditional art. As shown, LFOV image 403 includes four sub-FOV fields 404 captured with one stage move. The imaging action steps again as illustrated by arrow 402. It is noted that usually the fly-back time of the charged-particle beam, such as an electron beam, between each sub-field raster scan is negligible. It is also noted that the number of sub-fields does not change the number of stage steps. The number of stage moves depends mainly on the size of LFOV. For the implementation of a LFOV 12 times larger than a normal FOV, the number of stage steps in optimal cases can be reduced by a factor of 144. However, as endless demand for higher throughput in EB inspector applications pushes toward higher pixel rates, with image raster time getting shorter and shorter, stage stepping time still remains as the top throughput-limiting factor in Step-and-Repeat mode imaging.

It may be noted that in FIG. 4(b) the width of the sub-FOV 404 is much smaller than its height. Line Scan is required to be driven by high speed (i.e., high bandwidth) electronic/electric circuitry, where enlarging the dynamic to extend the line length is limited by the requirement to maintain noise level to a required specification. Also, the beam scan optical scheme needs to be constructed in a simpler fashion, where the scan range is limited to keep the beam under tolerable blur. Moving the line scan to the next line can require much slower electronics, which may allow a designer to construct much larger dynamic ranges, staying in the noise tolerance. The slower operation may also allow a designer to choose a more sophisticated beam deflection scheme(s), which can allow the nominal beam path to be minimally impacted relative to the beam property when the line scan is moved gradually from the top to the bottom of the sub-FOV by a large distance.

FIG. 5 illustrates Continuous-Scan mode imaging in accordance with the traditional art. Unlike Step-and-Repeat mode, which relies on raster scanning to achieve both line scan and line-to-line stepping to cover a full frame of image, as shown, in Continuous-Scan mode the stage moves at a constant speed. More particularly, the stage moves at a constant speed along a stage-moving direction 502 while an e-beam repeatedly line scans at a fixed offset from optical axis in a line-scan direction 501 usually perpendicular to the stage-moving direction 502. The stage continuously moves for the imaging action to be continuously performed, as illustrated by arrow 503, until a desired quantity (e.g., length) of image is acquired. This can form a relatively long image/frame. It is noted that in Continuous-Scan mode the sample is scanned at an equal pitch of the stage speed multiplied by the line scan period.

FIG. 6(a) illustrates an AOI being imaged in Continuous-Scan mode in accordance with the traditional art. As shown, a large AOI 601 can be covered by multiple long images formed by raster scanning in Continuous-Scan mode. It may be noted that the stage-moving direction alternates though the neighboring images, as shown by the curved arrows 602, known as a serpentine stage scan, to minimize stage-moving time between each image scan. The time period of such alternating stage movement is known as the stage turnaround time.

Continuous-Scan mode provides much higher throughput compared with Step-and-Repeat mode for a large AOI, because stage stepping times required in Step-and-Repeat mode can be significantly reduced. The number of stage turnarounds is only a function of the AOI height divided by the line scan width, thus the stage-scan direction is generally chosen to be parallel to the long side of the AOI rectangles.

The line scan width, that is, the height of the inspection image in Continuous-Scan mode, is limited by two factors: (1) image FOV of electron optic design; (2) high speed scan requirement and tolerable scan/detection noise. For inspection of a small AOI which is relatively narrow in width, for example along the stage-moving direction, the inspector has to stack up a number of inspection images to cover the height of the AOI, accumulating stage turnaround actions while the actual imaging time per image is small due to the limited width of the small AOI. Stage turnaround time is usually larger than the stage stepping time by approximately a factor of 0.7 to 2.0.

FIG. 6(b) illustrates imaging of a small AOI in Continuous-Scan mode and in Step-and-Repeat mode using LFOV in accordance with the traditional art. As shown, assuming AOI 603 has a height of 24K, if the height of the Continuous-Scan mode image is 2K pixels, 8 stage turnaround actions are required to cover AOI 603. On the other hand, with the use of LFOV and a size of 12K pixels, only 3 stage steps are required for the Step-and-Repeat mode operation. Therefore, the Step-and-Repeat mode with LFOV benefits the imaging of small AOI, as the number of stage steps can be less than the number of stage turnarounds in Continuous-Scan mode.

For scattered smaller AOIs or arrays of small AOIs within a die, Continuous-Scan mode wastes more time either on the non-AOI region with the stage moving at the constant speed of imaging, or with the stage frequently skipping the non-AOI region at a higher speed but then taking extra time to settle back to the constant speed of imaging before entering an AOI. In such cases, the original throughput advantage of Continuous-Scan mode over Step-and-Repeat mode often diminishes steeply and may even become worse than Step-and-Repeat mode.

FIG. 7(a) and FIG. 7(b) respectively illustrate the imaging of scattered small AOIs 701 in Continuous-Scan mode and in Step-and-Repeat mode using LFOV in accordance with the traditional art. As shown, again with the use of LFOV, Step-and-Repeat mode benefits the imaging of small AOIs 701, as the number of stage steps (3×3=9) can be less than the number of stage turnarounds in Continuous-Scan mode (6+6+3=15).

Accordingly, what is needed is a system and method that overcomes the above identified issues. The present invention addresses such a need.

SUMMARY OF THE INVENTION

The present invention provides EB inspectors with a method to acquire images of pixel arrays by moving the wafer stage at a constant speed and scanning the electron beam in a raster-scan fashion (e.g., 2-dimensional scan).

The proposed method removes stage-stepping overhead time between frames of images required in traditional raster-scan operation in Step-and-Repeat mode. In addition, the number of stage turnarounds can be reduced due to the enlarged FOV.

In some embodiments of the present invention, the proposed method also provides flexible ways to efficiently acquire images over small AOIs (e.g., relatively narrow in width along the stage-moving direction) evenly or randomly distributed along the stage-moving direction, where the conventional Continuous-Scan mode imaging suffers throughput lost.

In other embodiments of the present invention, the proposed method also allows line-scan to be performed in the stage-moving direction which is not possible in conventional continuous-scan imaging.

BRIEF DESCRIPTION OF THE DRAWINGS

FIG. 2(*b*) illustrates the formation of an image of a raster-scanned substrate in accordance with the traditional art.

FIG. 4(*b*) illustrates a Step-and-Repeat mode raster-scan imaging operation using a LFOV with multiple sub-fields in accordance with the traditional art.

FIG. 6(*b*) illustrates imaging of a small AOI in Continuous-Scan mode and in Step-and-Repeat mode using a LFOV in accordance with the traditional art.

FIG. 7(*a*) illustrates imaging of scattered small AOIs in Continuous-Scan mode in accordance with the traditional art.

FIG. 7(*b*) illustrates imaging of scattered small AOIs in Step-and-Repeat mode using a LFOV in accordance with the traditional art.

DETAILED DESCRIPTION OF THE INVENTION

The present invention relates generally to an apparatus and method to obtain an image of a sample. The sample can be a patterned substrate such as a wafer or lithography mask, but will be referred to as "sample" hereinafter for simplicity. The following description is presented in the form of exemplary embodiments to enable one of ordinary skill in the art to make and use the invention and is provided in the context of a patent application and its requirements. Various modifications to the preferred embodiment(s) and the generic principles and features described herein will be readily apparent to those skilled in the art. Thus, the present invention is not intended to be limited to the embodiments shown but is to be accorded the widest scope consistent with the principles and features described herein.

A tradition raster-scan signal is generally configured to image a frame of square area, that is, where line scan width equals frame height. All of the embodiments herein and related figures are not intended to be restricted to such, and can be extended, for example, to other rectangles or parallelograms with one side shorter or longer than the adjacent ones.

As mentioned earlier, the present invention generally discloses a method and apparatus for raster scanning over a sample secured on a continuously moving stage. The stage may be moved at a constant speed, that is, at a fixed speed and direction, or simply along a fixed direction. The raster scans form scan lines on the surface of the sample. A number of adjacent scan lines produced by raster scanning forms a 2-dimensional line array which may be used to form a frame (of image data of the sample(s)). For convenience of explanation, formation of one such line array will be considered completion of one raster scan hereinafter.

Figure 8:
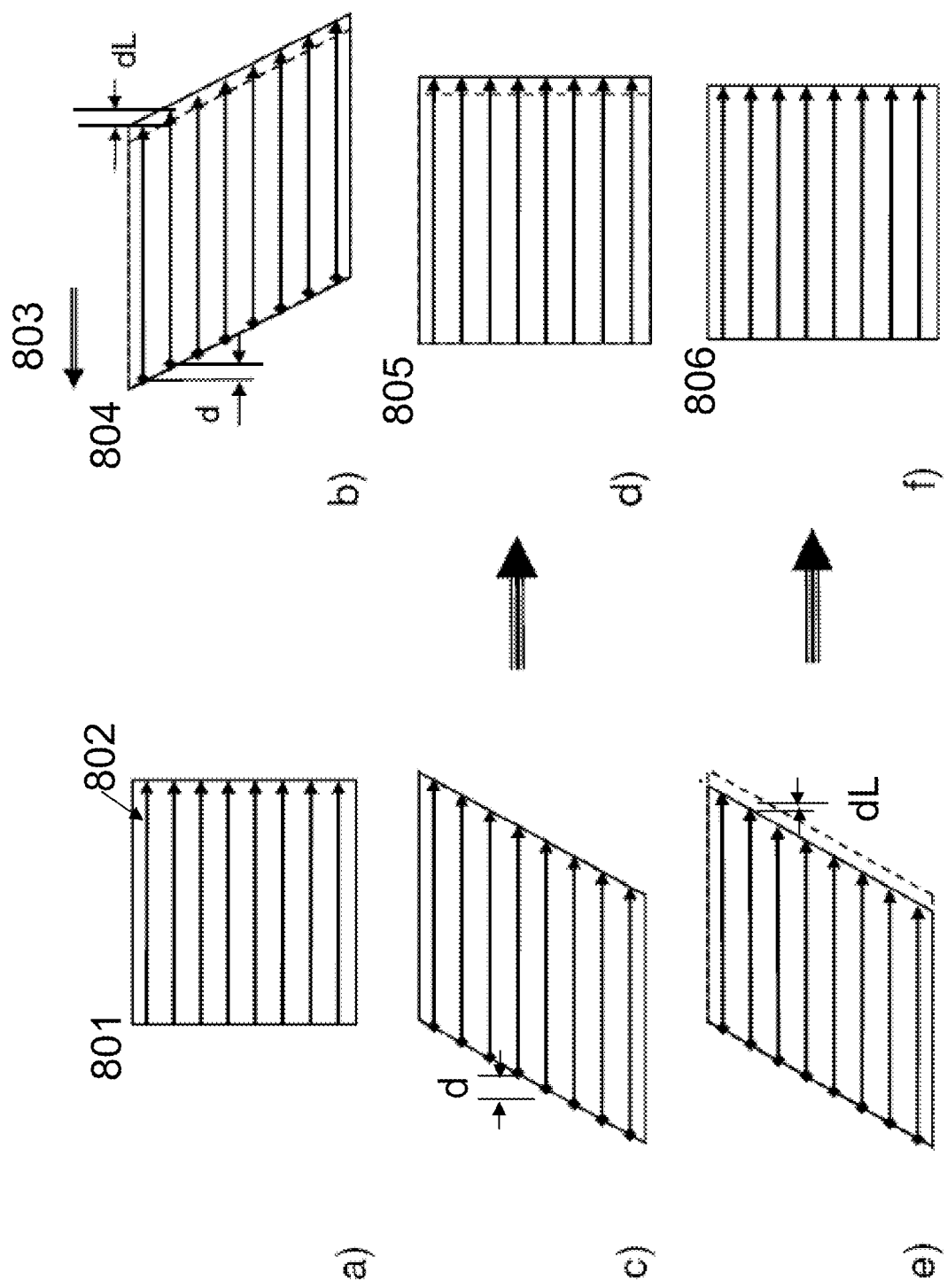
FIG. 8 illustrates operation of a raster-scanning method in accordance with an embodiment of the present invention.

In one embodiment of the present invention, a method for raster scanning a sample on a stage continuously moving along the line-scan direction is disclosed. FIG. 8 illustrates operation of a raster-scanning method in accordance with an embodiment of the present invention.

In FIG. 8(*a*), the charged-particle beam is raster scanned over a sample which is held at/in a stationary position. In such case, a square or rectangle image area is scan-imaged, and an image 801 is acquired accordingly as from the view of a stationary coordinate system which will be referred to as the "system coordinate" hereinafter. The system coordinate is always a stationary coordinate. On the other hand, a corresponding "moving coordinate" which will also be used frequently in this specification is the sample coordinate when the stage is moving. The coordinate being sampled thus is a moving coordinate when the stage is moving and is a stationary (system) coordinate when the stage is stopped.

In FIG. 8(b), the sample on the stage is moving along a direction 803 pointing to the left, opposite to the line-scan direction 802. In such a case, as shown, the beam will scan over a skewed parallelogram (e.g., rectangle) area on the sample and an image 804 will be acquired accordingly again as viewed in the moving sample coordinate. It is noted that the "positions" of the formed first scan lines in respective images 801 and 804 are the same. Therefore, for convenience of explanation for the following examples, the origin of the stationary coordinate system is set to be at the starting point of the first scan line as a reference.

In FIG. 8(c), to correct the skewed scan area resulting from the moving stage, a compensation offset is employed. It is noted that FIG. 8(c) corresponds to operation of a raster scan with compensation offset viewed in the system (stationary) coordinate. As shown, each time the line scan advances to the next line, the scanning beam (thus the starting point of the next scan line to be formed) is shifted by an accumulative fixed distance of $$d = \text{StageSpeed} \times \text{LineScanPeriod}$$

In short, the distance d is substantially equal to the stage travel/motion during one line scan, as shown in FIG. 8(b). In other words, to compensate the skewed angle that would result in the formed frame of image due to the stage motion, raster scan can be performed in a skewed manner by offsetting the starting point of each line scan electrically to trace the stage movement, as shown in FIG. 8(c).

It is noted that the line scan period refers to the time period of formation of a physical scan line. This scan line has a width which will be referred to as the line scan width hereinafter. The physical scan line does not necessarily need to be the effective scan line from which the image signals are collected and used to form the image. The effective scan line width may be shorter than the physical scan line width.

Having said this, as will be understood by those skilled in the art, the frame of image can be formed from the effective scan line rather than the physical scan line. Therefore, the length of a formed frame, which will be referred to as the frame length or the length of frame hereinafter, can be longer or shorter than the (physical) scan line width. Furthermore, in the embodiment(s), as the line scan is performed along a direction parallel to the stage-moving direction, the scan line width, effective scan line width and length of frame all are measured along the stage-moving direction.

In FIG. 8(d), a corrected image viewed in the moving sample coordinate is illustrated. As shown, if the offset exactly matches stage movement, an image 805 with corrected vertical edge can be obtained.

It is noted that since the stage is continuously moving during line scanning, the effective line scan width will expand if the stage moves in the opposite direction to the line scan, or shrink if the stage moves in the same direction as the line scan, on the sample by an amount dL as shown in FIG. 8(b):

$$dL = \text{StageSpeed} \times \text{EffectiveLineScanTime},$$

in which EffectiveLineScanTime is the effective line scan time or, in other words, the time period of formation of the effective scan line. The effective line scan time is generally a specified portion of the entire line scan repetition period. The line scan width is dependent upon the strength of the line scan signal. Therefore, the line scan width, that is, the line scan signal strength, is adjusted to compensate dL so that scan width on the sample is matched to the intended line scan width, as shown in FIGS. 8(e) and 8(f). As a result, an image 806 with corrected scan-area width can be obtained.

Figure 9:
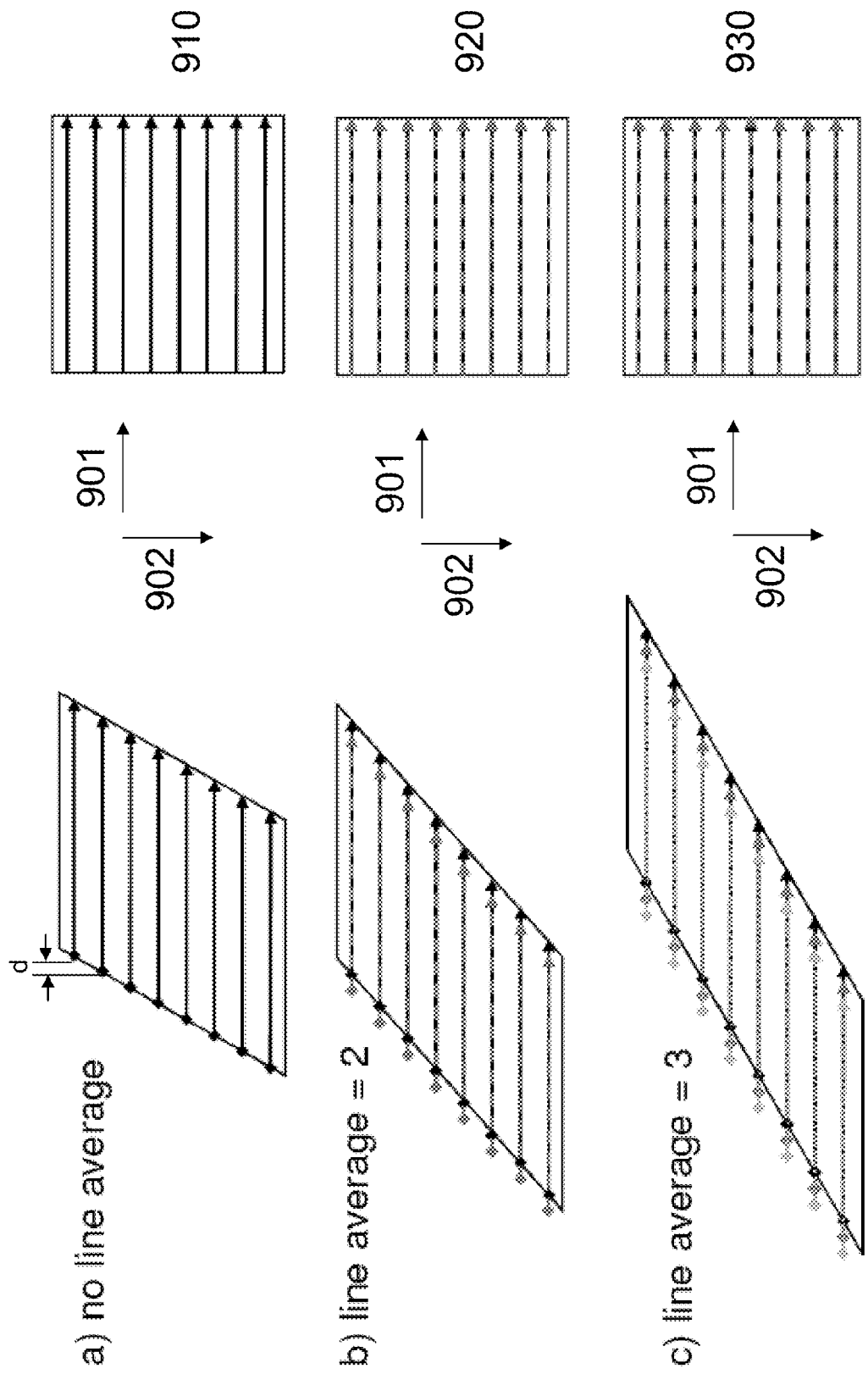
FIG. 9 illustrates a method of performing Line Averaging in accordance with an embodiment of the present invention.

In one embodiment, a method for performing Line Averaging in the proposed raster-scan operation is disclosed. FIG. 9 illustrates a method of performing Line Averaging in accordance with an embodiment of the present invention. Line Averaging can be performed by applying an accumulative offset, d, as that shown in FIGS. 8(b) and 8(c), at every single line scan in the sequence order at a fixed position in a line-to-line offset direction 902 of the raster scans. It is noted that the offset d can be accumulative with reference to, for example, the beginning of the first line scan of the current image whether it is being frame-averaged or not. In other words, the accumulative offset can be seen as a distance that the stage traveled since the beginning of the first line scan through the beginning of the current line scan (to be performed) of the image being formed. It is also noted that at the same time Frame Averaging may be performed to this concerned image as well, which case will be described in further detail later in conjunction with FIG. 10. It is also noted that the line-to-line offset direction 902 is typically perpendicular to the line-scan direction 901. For convenience of explanation, this fact will be kept true in all the embodiments of the present invention. For example, taking x as the line-scan direction and y as the line-to-line offset direction, the Line Averaging can be carried out by repeating line scans along the x direction at a fixed y position. Next, the line matrixes obtained from the repeated line scans are averaged, pixel by pixel, in the same way as described with reference to the prior art. An averaged line pixel matrix is thereby obtained. In FIG. 9(a), an image 910 without being Line Averaged is illustrated. In FIGS. 9(b) and 9(c), images 920 and 930 which are 2-fold and 3-fold Line Averaged, respectively, are illustrated. It is noted that in FIG. 9 the solid lines and arrows represent the original scan line formed first, while the gray broken lines and arrows represent the repeat scan lines formed later for delivering the effect of Line Averaging. It is also noted that the left-hand side portion of FIG. 9 is viewed from the system (stationary) coordinate, while the right-hand side portion of FIG. 9 is viewed from the sample (moving) coordinate.

Figure 10:
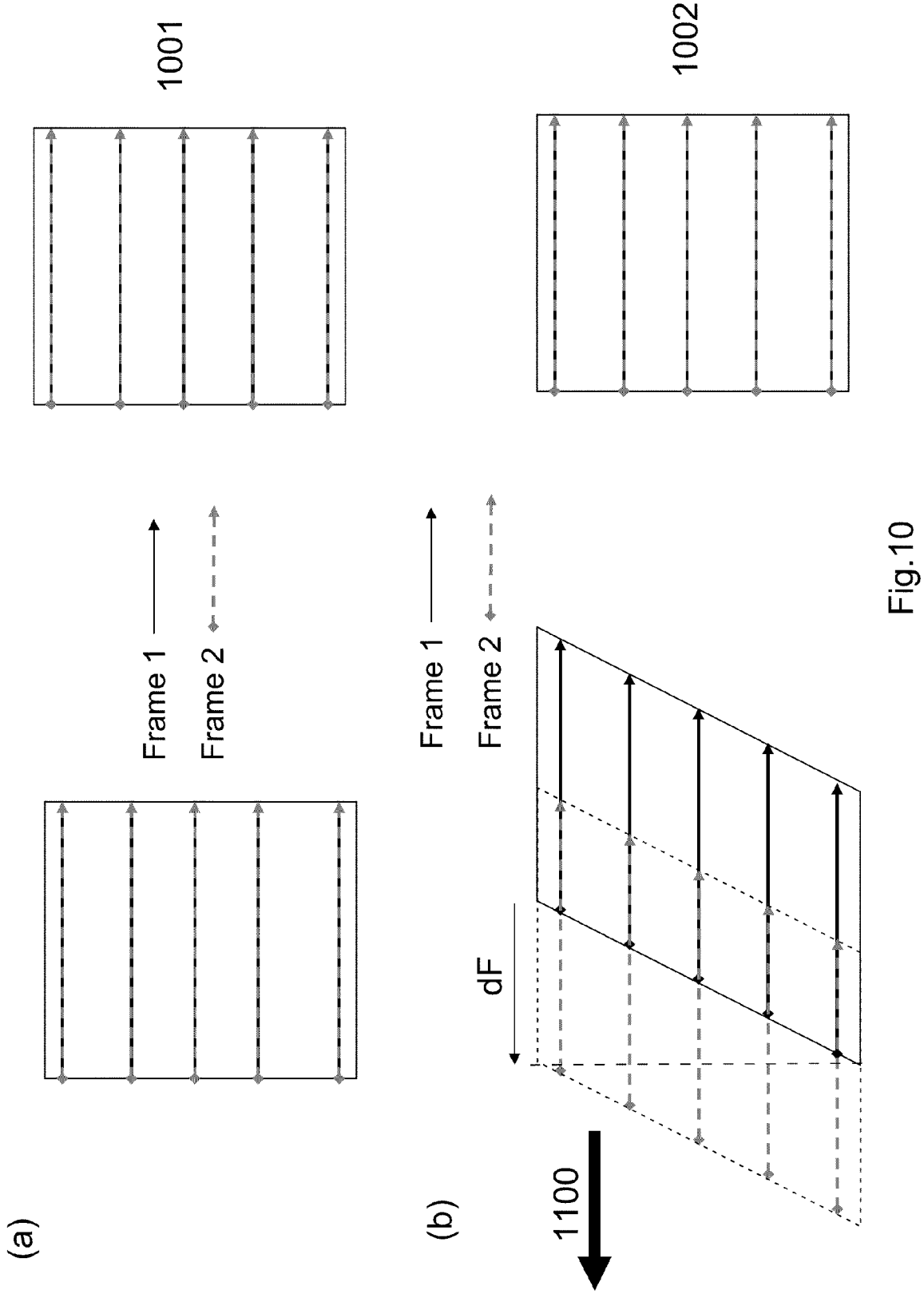
FIG. 10 illustrates a method of performing Frame Averaging in accordance with an embodiment of the present invention.

In one embodiment, a method for performing Frame Averaging in the proposed raster-scan operation is disclosed. FIG. 10 illustrates a method of performing Frame Averaging in accordance with an embodiment of the present invention. As shown, Frame Averaging can be performed by repeating the same raster-scan frame at the same position on the moving sample, which is realized by applying an accumulative offset of dF to the successive raster scans. It is noted that the offset dF can be accumulative with reference to, for example, the beginning of the first line scan of the first raster scan of this image being Frame Averaged. The offset dF thus can be represented as:

$$dF = \text{StageSpeed} \times \text{RasterScanRepetitionPeriod}.$$

It is noted that, as mentioned earlier, the accumulative offset is a distance that the stage has traveled since the beginning of the first line scan of the first raster scan of the image being Frame Averaged, through the beginning of the current line scan to be performed of the current raster scan of the image being Frame Averaged. Next, the obtained frame images are averaged pixel by pixel to form an averaged frame image. In detail, with reference to FIG. 10(a), the sample is at/in a stationary position. Raster scan is simply repeated at the same position on the sample for Frame 1 (solid lines and arrows) and Frame 2 (gray broken lines and arrows), and corresponding pixels are averaged to represent the pixels in the averaged image 1001 on the right. In FIG. 10(b), the sample is moving at a constant velocity along a direction 1100 pointing to the left. Raster scan for Frame 2 (gray broken lines and arrows) is performed following raster scan for Frame 1 (solid lines and arrows), with (accumulative) position offset dF to compensate the stage movement. As a result, corresponding line scans between Frame 1 and Frame 2 overlay in the sample (moving) coordinate. Corresponding pixels are averaged to represent the pixels on the averaged image 1002 on the right.

In one embodiment, a method for acquiring multiple successive frames on the moving sample is disclosed. Repeating the raster scans with accumulative line scan offset produces a series of rectangular images of the sample surface being equally spaced. It is noted that the line scan offset is reset between frames of images. Each time when a frame image is completed, the charged-particle beam is directed to the beginning position of the first line scan of the next frame image to be formed, and the line scan offset starts to accumulate again for the line scans within this next image to be formed, starting from the beginning of the first line scan thereof.

Figure 11:
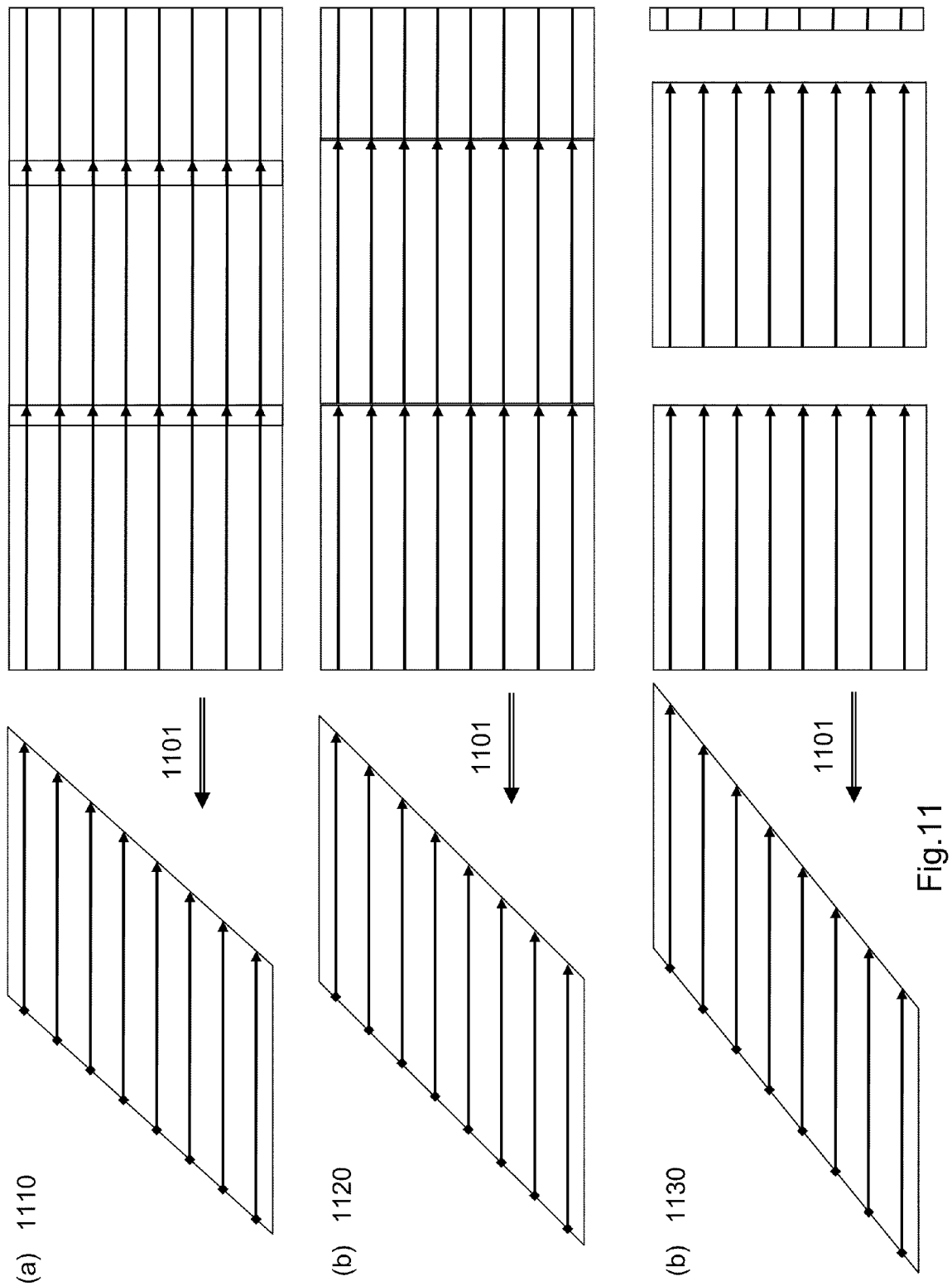
FIG. 11 illustrates an image acquisition method in different modes in accordance with an embodiment of the present invention.

FIG. 11 illustrates an image acquisition method in different modes in accordance with an embodiment of the present invention. Before going into the details of FIG. 11, a physical quantity, referred to as the image width, is defined. When raster scanning a sample, a frame image having a shape of a parallelogram is typically formed in the form of a 2-dimensional line array composed of a plurality of scan lines lying adjacent to each other. This parallelogram, which includes square and rectangle shapes as the most common cases, has two parallel-edge pairs. At least one of the two parallel-edge pairs, or its extension lines, would intersect with the axis of the stage movement. The image width in the embodiments of the present invention refers to the distance, along the axis of stage movement, between the two intersection points of the parallel edges (or their extension lines) with the axis of stage movement. This definition holds true for all embodiments of the present invention, regardless of the shape of the formed frame image. With the image width defined, a series of images can be acquired in different ways using the image width as an operational factor. As shown, depending on the stage speed, the series of the images acquired is/are:

(a) Partially overlapped if StageSpeed<ImageWidth/RasterScanRepetitionPeriod, (b) Stitched if StageSpeed=ImageWidth/RasterScanRepetitionPeriod, and (c) Gapped by a space if StageSpeed>ImageWidth/RasterScanRepetitionPeriod.

It is noted that in this embodiment, the image width is substantially the length of the effective scan lines, as shown in FIG. 11.

This embodiment can also provide a way to evenly sample fractions of image areas (e.g., evenly sampling imaging fraction of areas) inside a large area of interest (AOI). For instance, if the separation is equivalent to the width of a frame image, a sampling ratio of 50% can be employed.

In FIG. 11(*a*), a series of partially overlapped frame images 1110 along the stage-moving direction 1101 is acquired. In this case, the stage speed is set to be smaller than ImageWidth/RasterScanRepetitionPeriod. In practice, a certain amount of overlap is necessary when capturing a series of frame images to compensate for possible position error, or to get more marginal areas which may later be sacrificed in image processing, such as image alignment.

If the overlap ratio is not less than ½ and can be expressed as (2N−1)/2N, (N=1, 2, 3, . . . successive images of N frame average will be produced. For instance, an overlap ratio of ½ corresponds to 2-frame averaging; an overlap ratio of ¾ corresponds to a 4-frame averaged image being obtained. It is noted that a certain fraction of $1^{st}$ and last frames in one successive acquisition are not fully overlapped with the same amount of frames and should be sacrificed. It is also noted that the embodiment of frame averaging here is different from the embodiment shown in FIG. 10, as in FIG. 10 the image is averaged by frames of a full size image, while in FIG. 11 the image is averaged by fractional images.

Figure 4A:
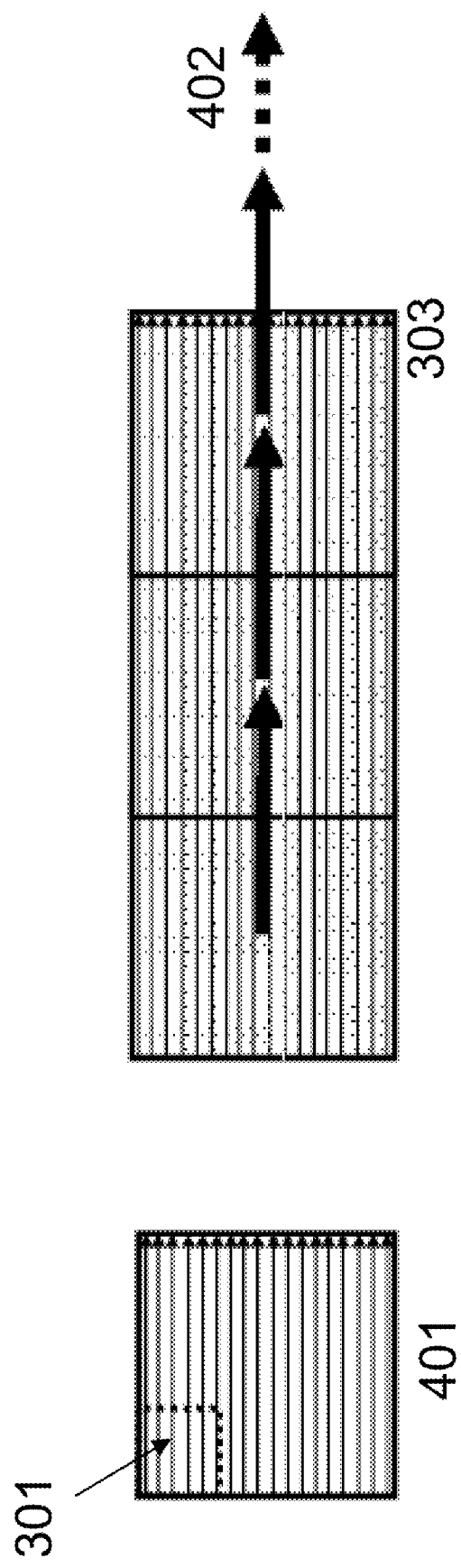
FIG. 4(*a*) illustrates a Step-and-Repeat mode using a Large Field of View (LFOV) in accordance with the traditional art.
Figure 12:
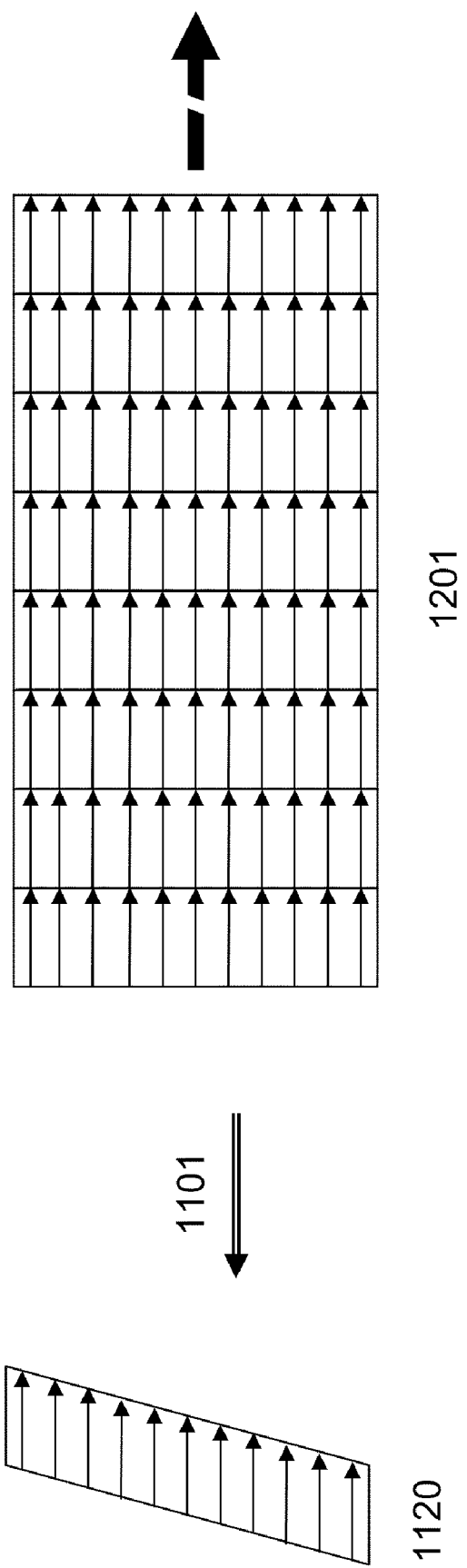
FIG. 12 illustrates acquisition of stitched images in accordance with an embodiment of the present invention.

In FIG. 11(*b*), a series of frame images 1120 connected (with each other) along the stage-moving direction is acquired. This is also illustrated in FIG. 12 in more detail. In this case, the stage speed is set to be substantially equal to ImageWidth/RasterScanRepetitionPeriod. FIG. 12 illustrates acquisition of stitched images in accordance with an embodiment of the present invention, wherein the acquired image 1120 viewed in the system (stationary) coordinate is illustrated on the left and the same image viewed in the sample (moving) coordinate is illustrated on the right as 1201. As shown in FIG. 12, this case is similar to the FIG. 4 traditional Step-and-Repeat mode, with a difference being that no stage-stepping overhead is incurred during imaging along the stage-moving direction, whereby the throughput is improved.

Figure 5:
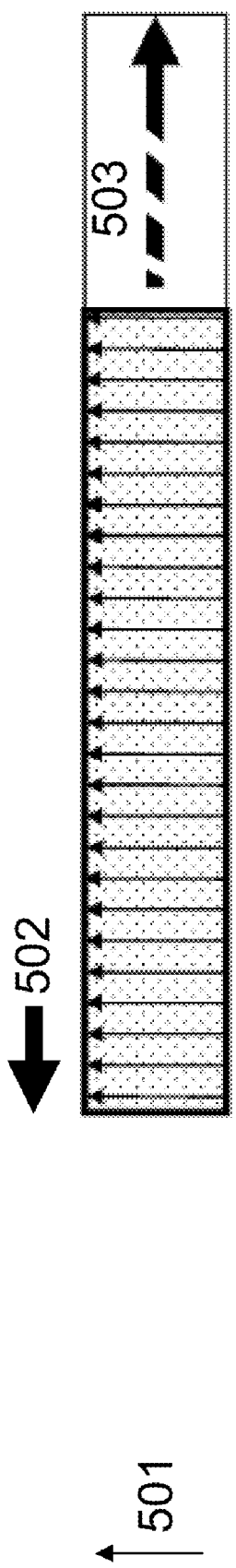
FIG. 5 illustrates Continuous-Scan mode imaging in accordance with the traditional art.
Figure 6A:
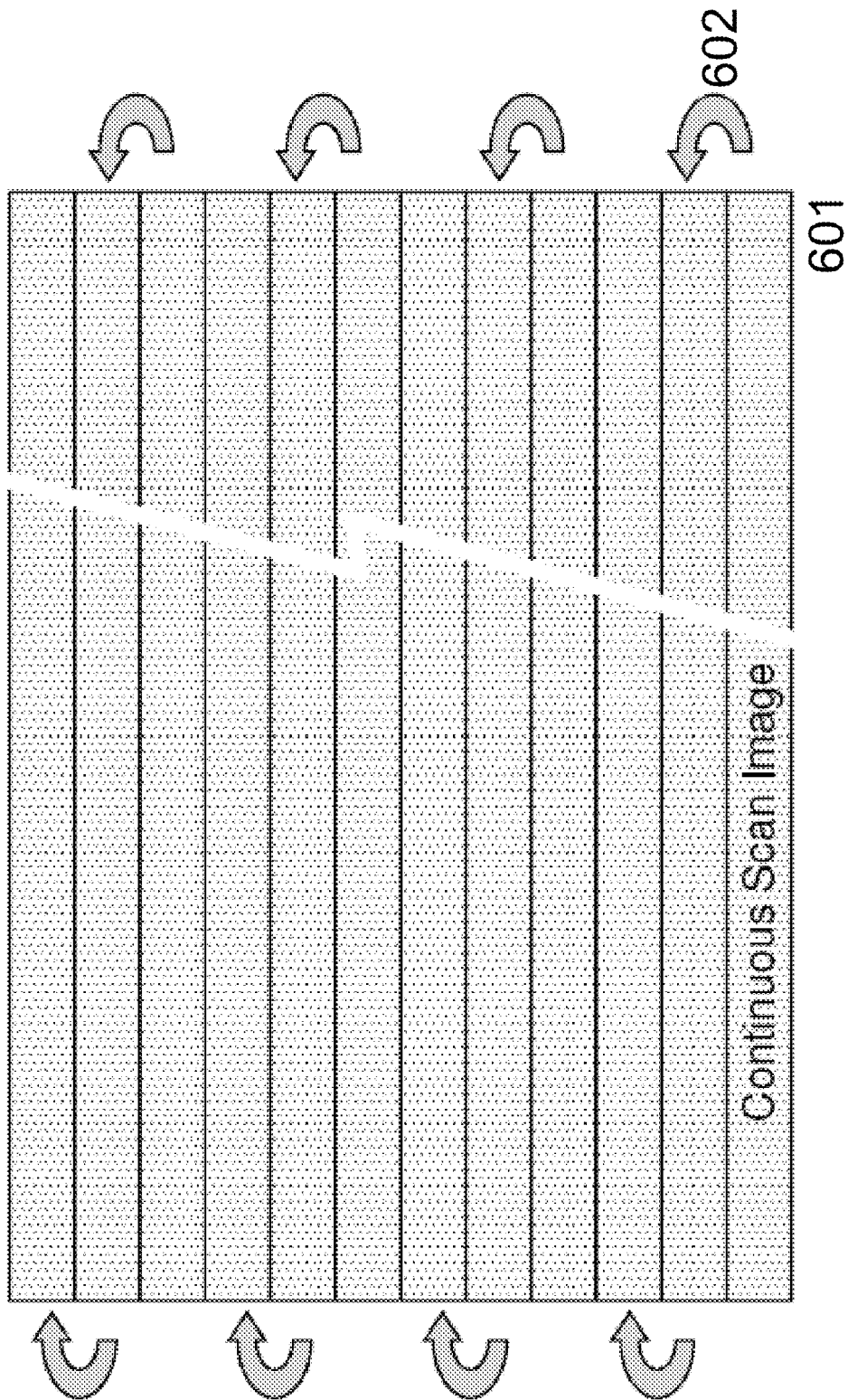
FIG. 6(*a*) illustrates an AOI being imaged in Continuous-Scan mode in accordance with the traditional art.
Figure 6B:
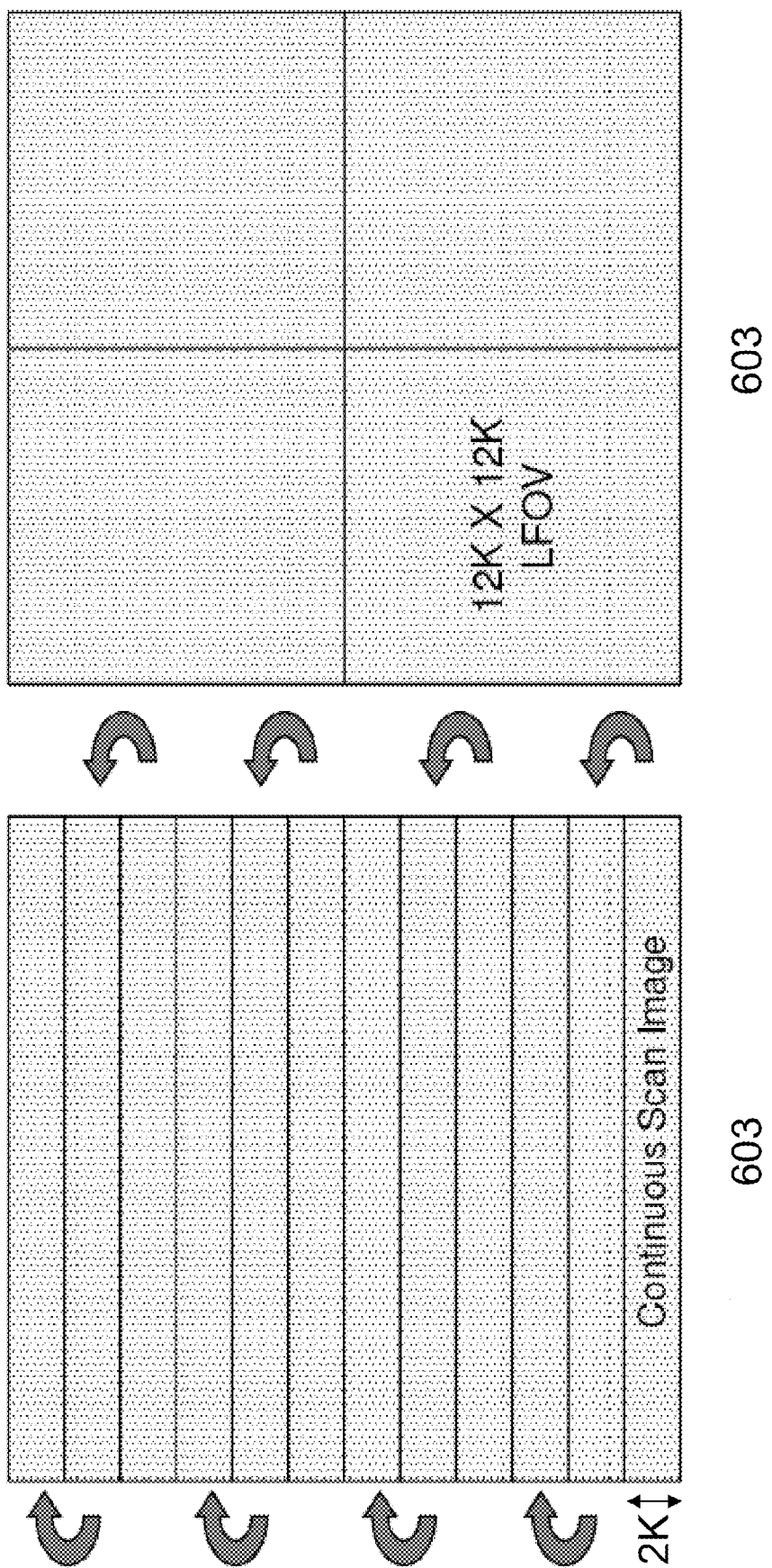

On the other hand, when compared with traditional Continuous-Scan mode imaging as shown in FIG. 5, the advantage of the embodiment in FIG. 12 is its flexible frame length control whereby, first, the height of the frame image can be made larger than that in the traditional Continuous-Scan mode, which is substantially equal to the line-scan width. As a result, an imaging task of AOIs of a height greater than the line-scan width will benefit from this embodiment, as a smaller number/amount of stage turnaround action(s) is needed to cover a given AOI. Moreover, the height of frame image can also be made shorter than the line-scan width as in the traditional Continuous-Scan mode. An imaging task of AOIs with a height smaller than line-scan width will benefit from this case as the number of line-scans in a frame image is reduced and/when the stage can be moved at a faster speed.

Figure 13:
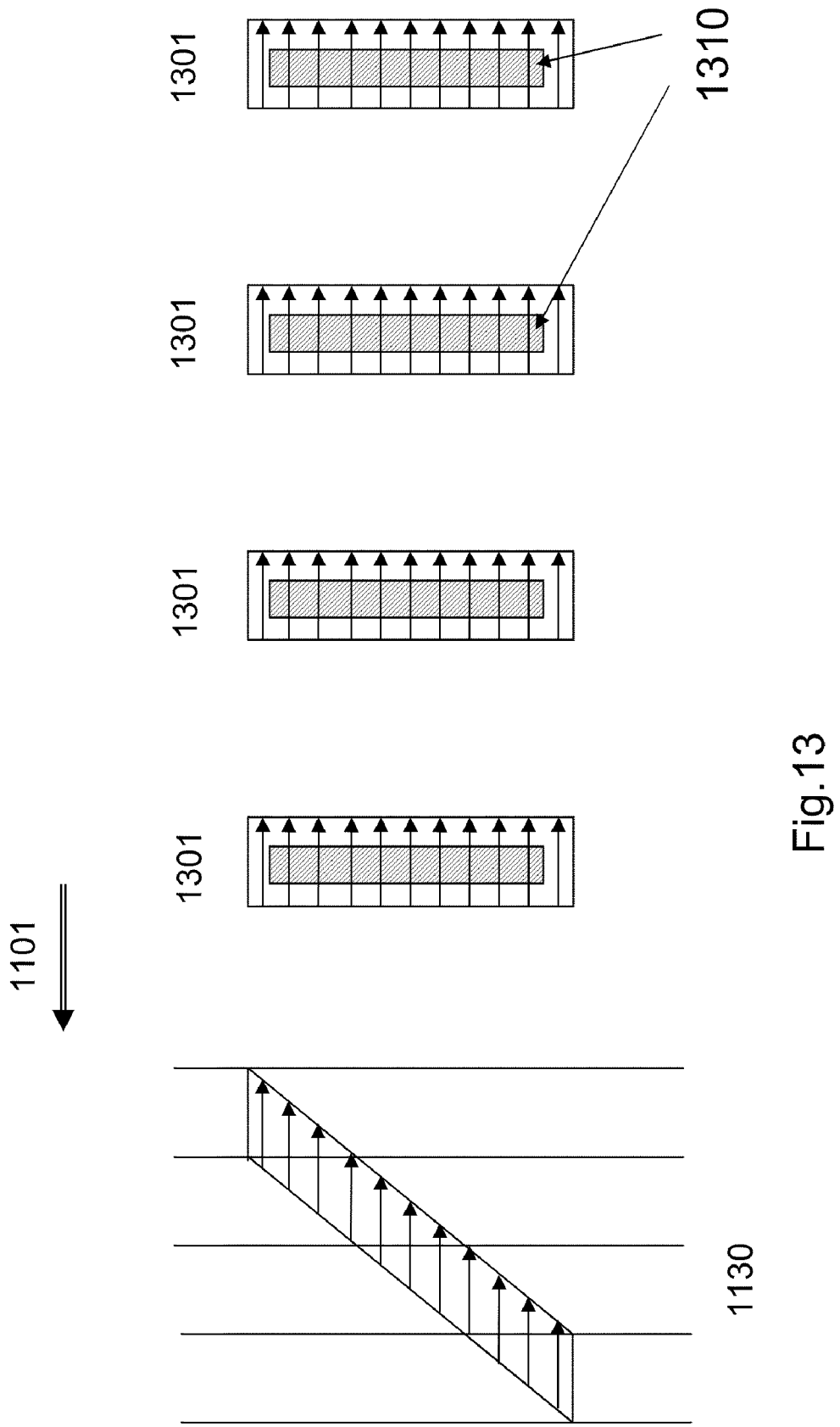
FIG. 13 illustrates acquisition of spaced images in accordance with an embodiment of the present invention.

In FIG. 11(*c*), a series of frame images 1130 equally spaced along the stage-moving direction 1101 is acquired. This is also illustrated in FIG. 13 in more detail. In this case, the stage speed is set to be greater than ImageWidth/RasterScanRepetitionPeriod. FIG. 13 illustrates acquisition of spaced images in accordance with an embodiment of the present invention, wherein the acquired image 1130 viewed in the system (stationary) coordinate is illustrated on the left and the same image viewed in the sample (moving) coordinate is illustrated on the right as 1301. Every frame of image 1301 is evenly spaced with this embodiment. One particular application for this embodiment is the imaging of narrowly and equally spaced arrays of AOIs 1310. In such case, the narrow side of AOI 1310 can be covered by one line-scan and the space between adjacent AOIs 1310 is less than the maximum length of a frame 1301. The length of each frame 1301 and the space between successive frames 1301 are controlled by stage speed, number of line scans per frame and step size of line scan.

It is noted that in FIG. 13, the individual AOI 1310 in the AOI arrays do not need to be equally spaced if the charged-particle beam inspection system based on scanning electron microscope (EB inspector) is configured such that (1) raster frame can be triggered, (2) raster-frame trigger timing is programmed in a sequencer, referencing the stage position in the sequencer, and (3) each raster scan in the sequence accepts scan offset, which is programmed in the sequencer.

Figure 14:
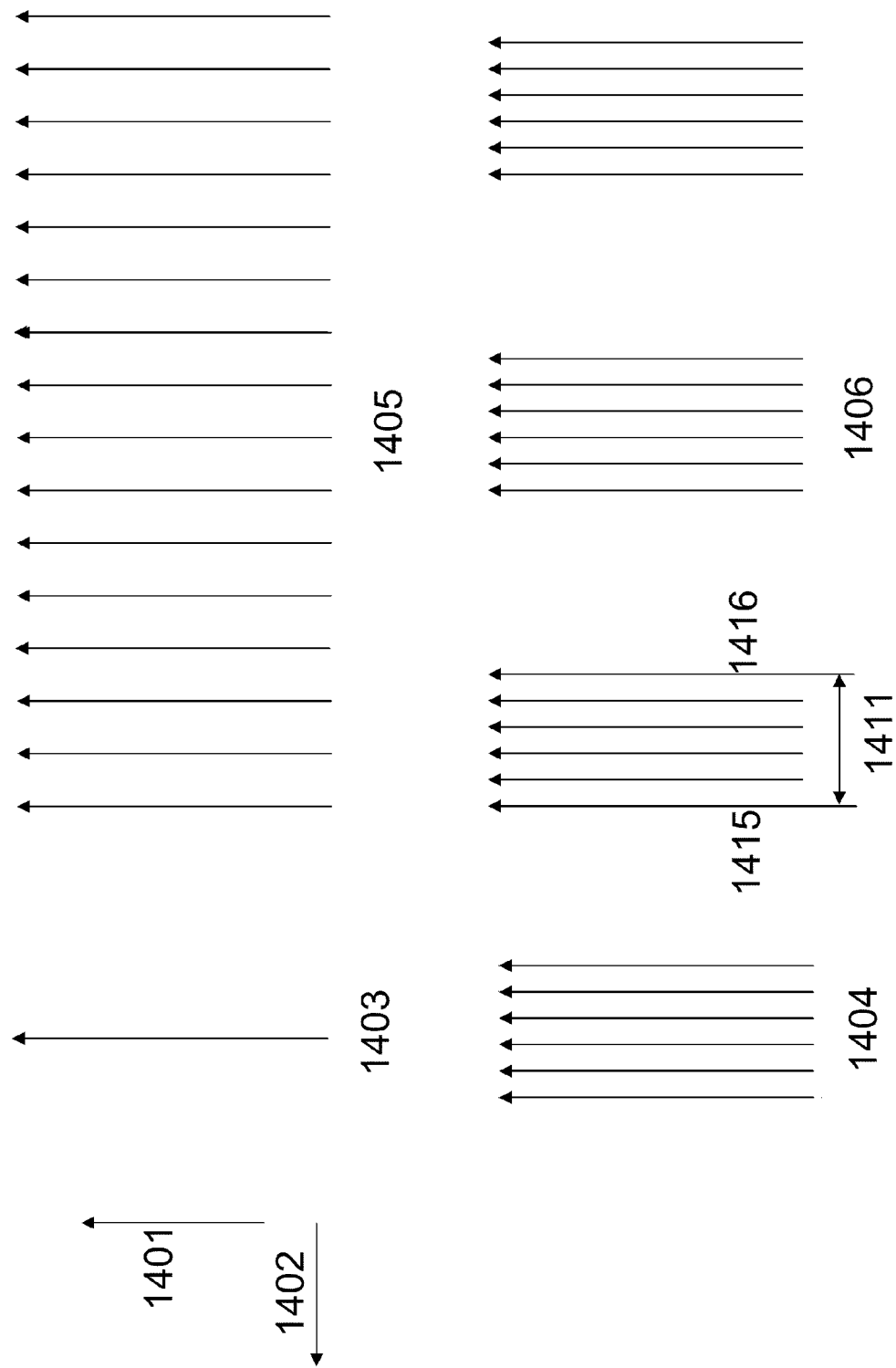
FIG. 14 illustrates a raster scan over a sample with a stage-moving direction perpendicular to the line-scan direction in accordance with an embodiment of the present invention.

So far the embodiments of the present invention have been disclosed in the context of providing a raster-scan method where the line-scan direction is parallel to the stage-moving direction. In other embodiment, alternative relationships of the line-scan direction with the stage-moving direction are also possible. FIG. 14 illustrates a raster scan over a sample on a stage moving at constant speed, and whose direction is perpendicular to the line-scan direction, in accordance with an embodiment of the present invention.

In FIG. 14, the stage-moving direction is horizontal as illustrated by the left-pointing arrow 1402, and the line-scan direction is vertical as illustrated by upwardly-directed arrow 1401. The upper portion of FIG. 14 illustrates the traditional Continuous-Scan mode. The arrow 1403 on the left represents the repeating line scanning action. The right-hand side drawing 1405 illustrates the acquired image viewed in the sample (moving) coordinate. As shown, in the traditional Continuous-Scan imaging mode the line scan is repeated at an equal pitch of the stage speed multiplied by the line scan period. The lower portion of FIG. 14 illustrates the proposed raster-scan operation according to the current embodiment. The arrow array 1404 on the left represents the raster-scanning action. The right-hand side drawing 1406 illustrates the acquired image viewed in the sample (moving) coordinate.

With continuing reference to the embodiment of FIG. 14, raster scan is applied in such a way that the line-scan direction 1401 is kept perpendicular to the stage-moving direction 1402, while the line-to-line advancement is a combined effect of the mechanical movement of the stage and the electrical offset within the raster scans. This embodiment will be identical to the conventional Continuous-Scan imaging of FIG. 5 when the line scan is kept at a fixed position during raster scanning.

According to this embodiment, again depending on the stage speed, the series of the images obtained by the proposed raster-scan method can be:

(a) Partially overlapped if StageSpeed<RasterScanRepetitionPeriod, wherein if the overlap ratio can be expressed as (2N−1)/2N, (N=1, 2, 3, . . . ), successive images of N frame-averaging will be produced, with, for instance, an overlap ratio of ½ corresponding to a 2-frame averaged image and an overlap ratio of ¾ corresponding to a 4-frame averaged image, (b) Stitched if StageSpeed=ImageWidth/RasterScanRepetitionPeriod, and (c) Gapped by a space if StageSpeed>ImageWidth/RasterScanRepetitionPeriod.

In this embodiment, as the scan lines are perpendicular to the stage moving direction, a rectangular image (frame-averaged or not) is formed from the raster scans with two of its edges intersecting the axis of stage movement at a right angle. The image width therefore can be selected to be the distance 1411 between the first and last formed scan lines 1415 and 1416 within one line array formed by the raster scans, as shown in the lower portion of FIG. 14.

Again this embodiment can also be a way to evenly sample fractions of areas within a large AOI; for instance, a separation equivalent to the width of a frame image can correspond to a sampling ratio of 50%.

Figure 15:
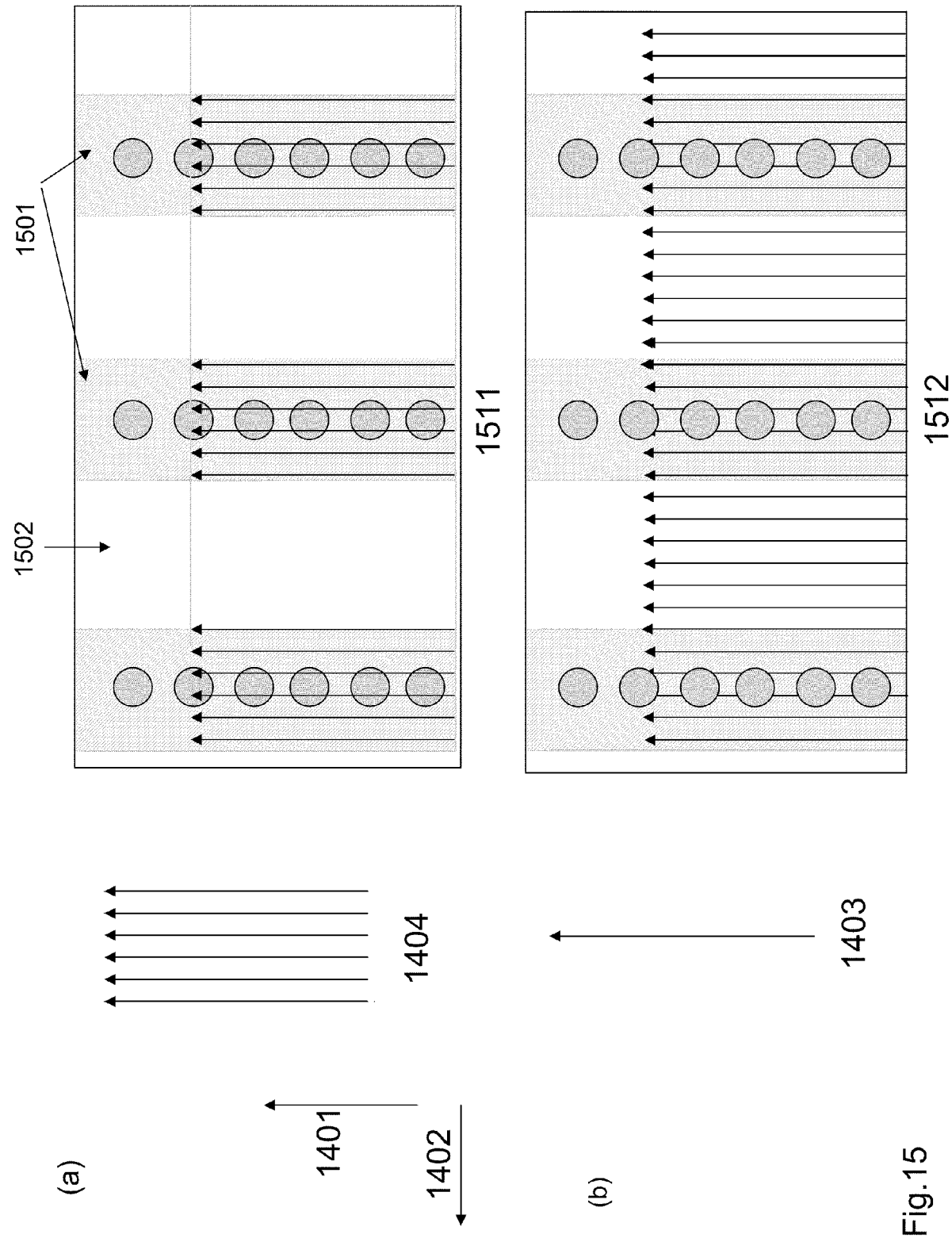
FIG. 15 illustrates raster-scanning spaced narrow AOIs in accordance with an embodiment of the present invention.

One particular application for the embodiment illustrated in FIG. 14 is the raster scanning of narrow AOIs. FIG. 15 illustrates raster-scanning spaced narrow AOIs in accordance with an embodiment of the present invention. As shown in FIG. 15, again as in FIG. 14, the line-scan direction 1401 of the raster scans 1404 is set to be perpendicular to the stage-moving direction 1402.

For reference, the bottom region of the FIG. 15 drawing (cf. FIG. 15(b)) illustrates a traditional Continuous-Scan mode in which arrow 1403 on the left represents the repeating line scanning action. In the upper right-hand part of the drawing, reference number designator 1512 elucidates the acquired image viewed in the sample (moving) coordinate, which is intended to cover the narrow AOIs 1501 spaced by non-interest or blank regions (i.e., where no patterns are formed) 1502. As shown, in the traditional Continuous-Scan imaging mode the line scan is repeated at an equal pitch of the stage speed multiplied by the line scan period. As a result, AOI 1501 and non-interest/blank region 1502 are equally scanned and imaged. In such case, part of the tool time is wasted on scanning non-interest/blank regions 1502. FIG. 15(a) illustrates the proposed raster-scan operation of this embodiment. The arrow array 1404 on the left represents the raster-scanning action. The right-hand side drawing 1511 illustrates the acquired image viewed in the sample (moving) coordinate, which is intended to cover the spaced narrow AOIs 1501.

As shown, an advantage of this embodiment is that the width of the frame (here, it is the number of line-scans in the concerned frame along the stage-moving direction) on the sample can be made small to fit the narrow AOI 1501. This task is similar to the case shown in FIG. 13 in which a fixed line-scan width is kept during the raster scanning. This may lead to some tool time wasted on each line-scan outside the narrow AOI 1501. In the embodiment of FIG. 15, however, as its line-scan direction is along the longer edge of narrow AOI 1501, a majority of a line scan can be utilized to cover the AOI 1501, resulting in a more efficient use of each line scan action. Therefore, the embodiment of FIG. 15 is suitable for an array of narrow AOIs, such as 1501, which are distributed and/or aligned along the stage-moving direction 1402 and equally spaced at relatively short pitch. The throughput of the inspection, accordingly, can be enhanced.

Because of the AOI 1501 relatively narrow dimension along the stage-moving direction 1401, raster scanning for imaging AOI 1501 may easily miss the target due to the real-time stage position error, wafer charging effect, etc. However, the drift of the target position is expected to be slow. Therefore, the system can be configured to monitor the position of the AOIs 1501 within the recent image frames 1511 and apply the scan offset in a real-time fashion to keep the AOI 1501 inside of coming image frames 1511.

In this embodiment, again the AOIs 1501 do not need to be equally or narrowly spaced if the EB inspector is configured such that (1) raster frame can be triggered, (2) raster-frame trigger timing is programmed in the sequencer, referencing to the stage position in the sequencer, and (3) each raster scan in the sequence accept scan offset, which is programmed in the sequencer.

Figure 16:
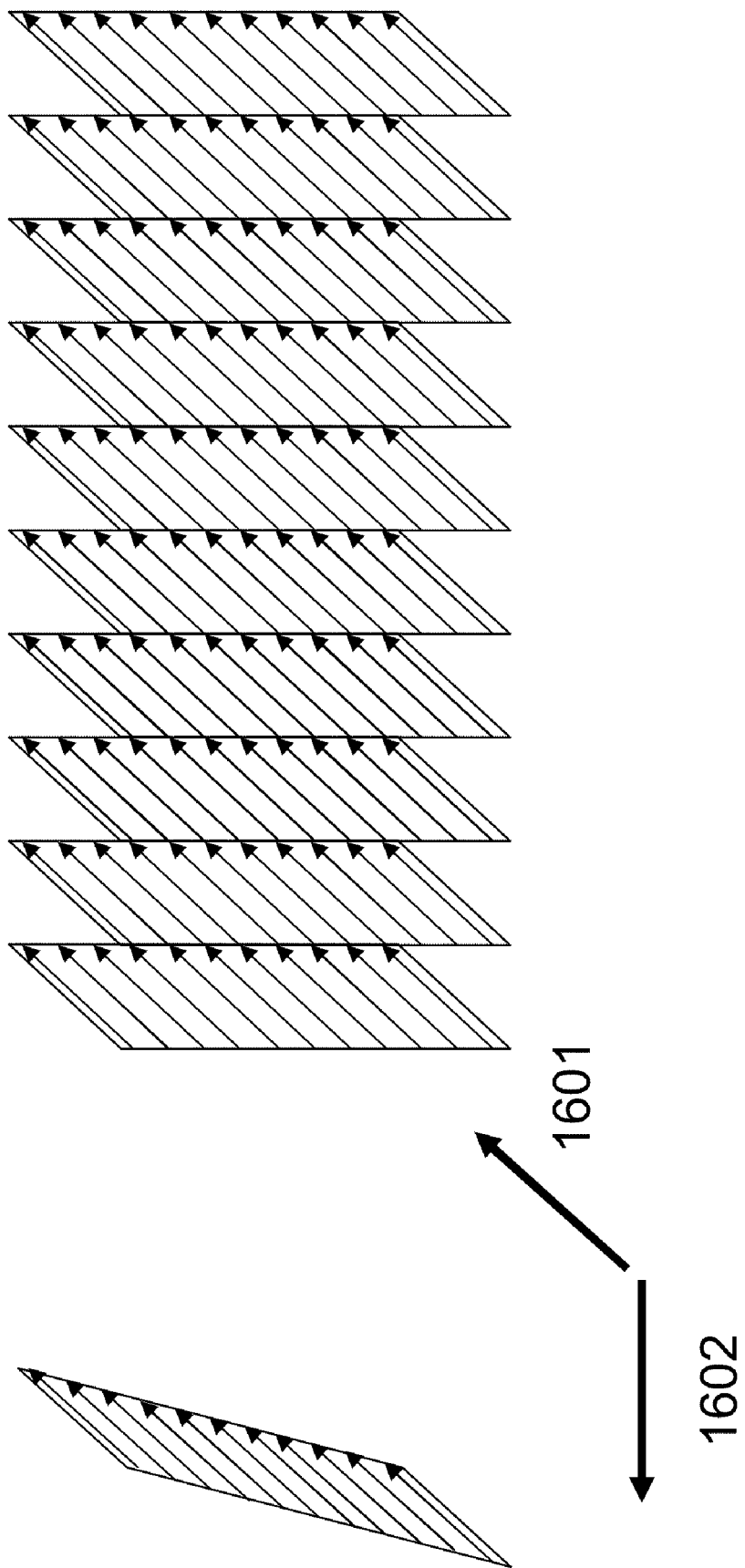
FIG. 16 illustrates a raster scan of a moving sample with a line-scan direction off angle from the stage-moving direction in accordance with an embodiment of the present invention.

In another embodiment, the line-scan direction is designed to be oriented at an angle with the stage-moving direction. In other words, the line scan is kept off-angle from the major orientation of the moving stage. FIG. 16 illustrates a raster scan of a moving sample with the line-scan direction off-angle from the stage-moving direction in accordance with an embodiment of the present invention. The left-hand side portion of FIG. 16 illustrates a raster scan performed on the system (stationary) coordinate. The right-hand side portion of FIG. 16 illustrates a raster scan performed on the sample (moving) coordinate. The stage-moving direction is horizontal and pointing to the left, as illustrated by arrow 1602, and the line-scan direction is illustrated by arrow 1601. As shown, the line-scan direction 1601 extends along a direction which intersects the stage-moving direction 1602 at an angle between 0 and 180 degrees but is off from the major system directions, the x and y directions. In other words, the angle between the line-scan direction 1602 and the stage-moving direction 1601 is not 0, 90 or 180 degrees, which means that the formed scan lines are "tilted" from the view point of the axis of stage movement.

In this embodiment, again depending on the stage speed, the series of images obtained by the proposed raster-scan method can be (a) Partially overlapped if StageSpeed<ImageWidth/RasterScanRepetitionPeriod, (b) Stitched if StageSpeed=ImageWidth/RasterScanRepetitionPeriod, and (c) Gapped by a space if StageSpeed>ImageWidth/RasterScanRepetitionPeriod.

According to the depiction of FIG. 16 for this embodiment, the frame, or, say the line arrays formed from the raster scans, is an inclined parallelogram, with two vertical edges (or, say their extension lines) intersecting the axis of stage movement. The preferable image width for this embodiment can therefore be selected to be a distance along the axis of stage movement and between the intersection points of these two vertical edges and the axis of stage movement.

As will be understood by those skilled in the art, although the series of frames acquired are stitched, overlapped and/or spaced successive frames of images are also obtainable by way of, inter alia, selecting the stage-moving speed in accordance with the principles set forth herein.

Figure 1:
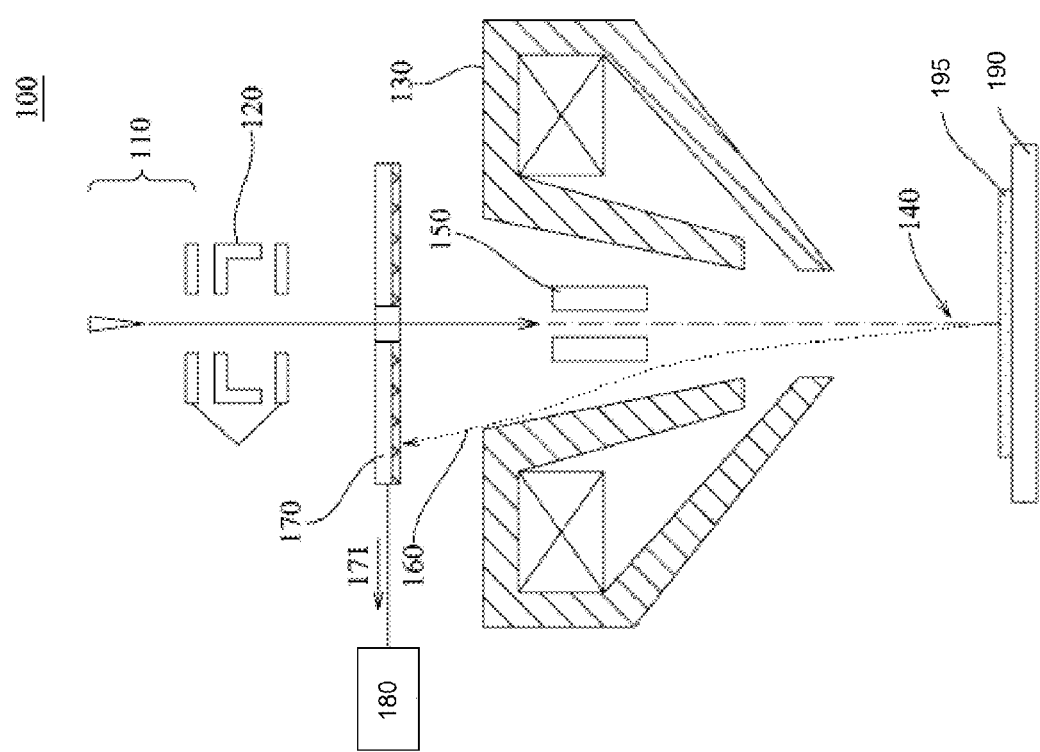
FIG. 1 illustrates a charged-particle beam microscope 100 in accordance with the prior art.
Figure 2A:
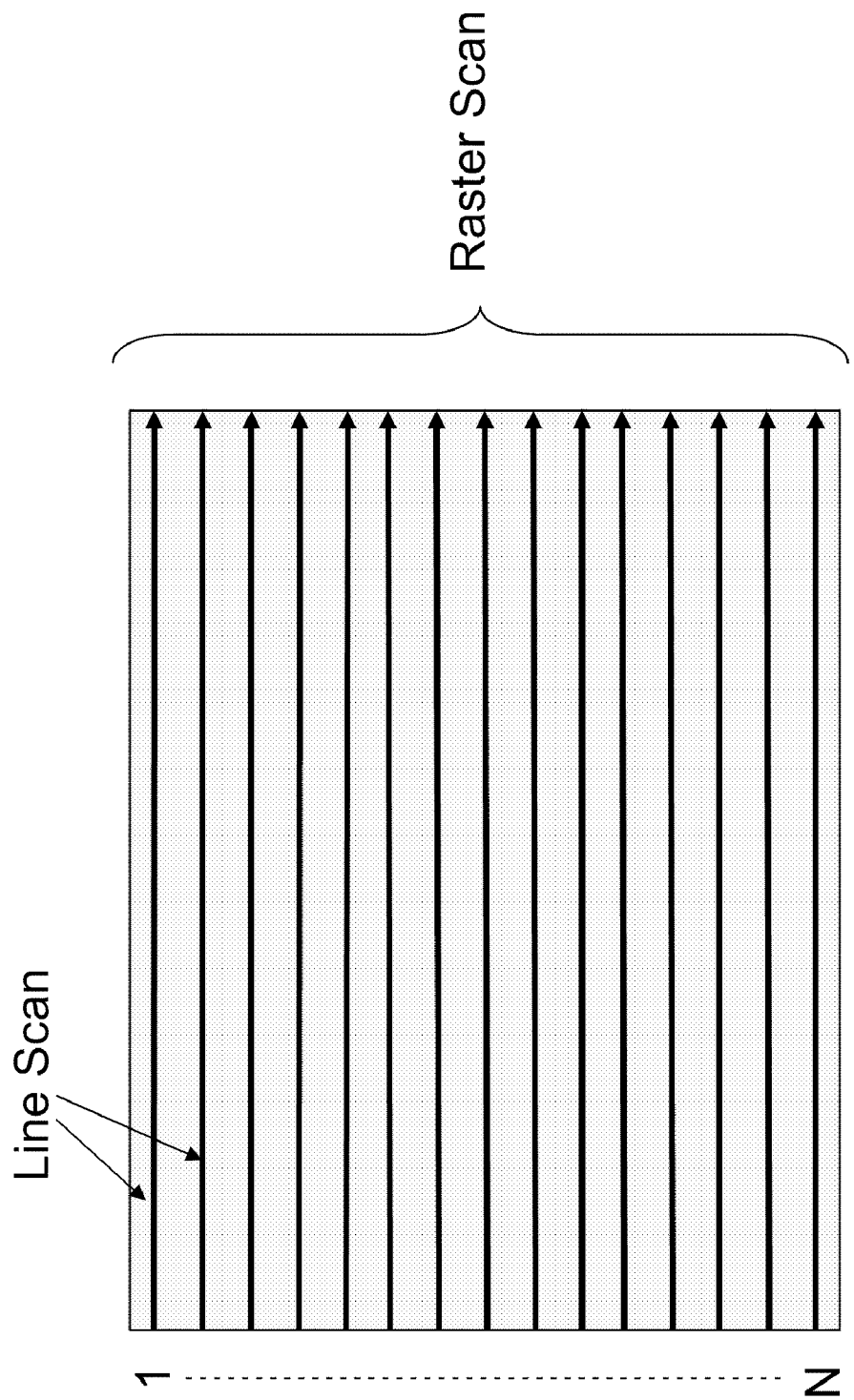
FIG. 2(*a*) illustrates a raster-scan operation in accordance with the traditional art.
Figure 2B:
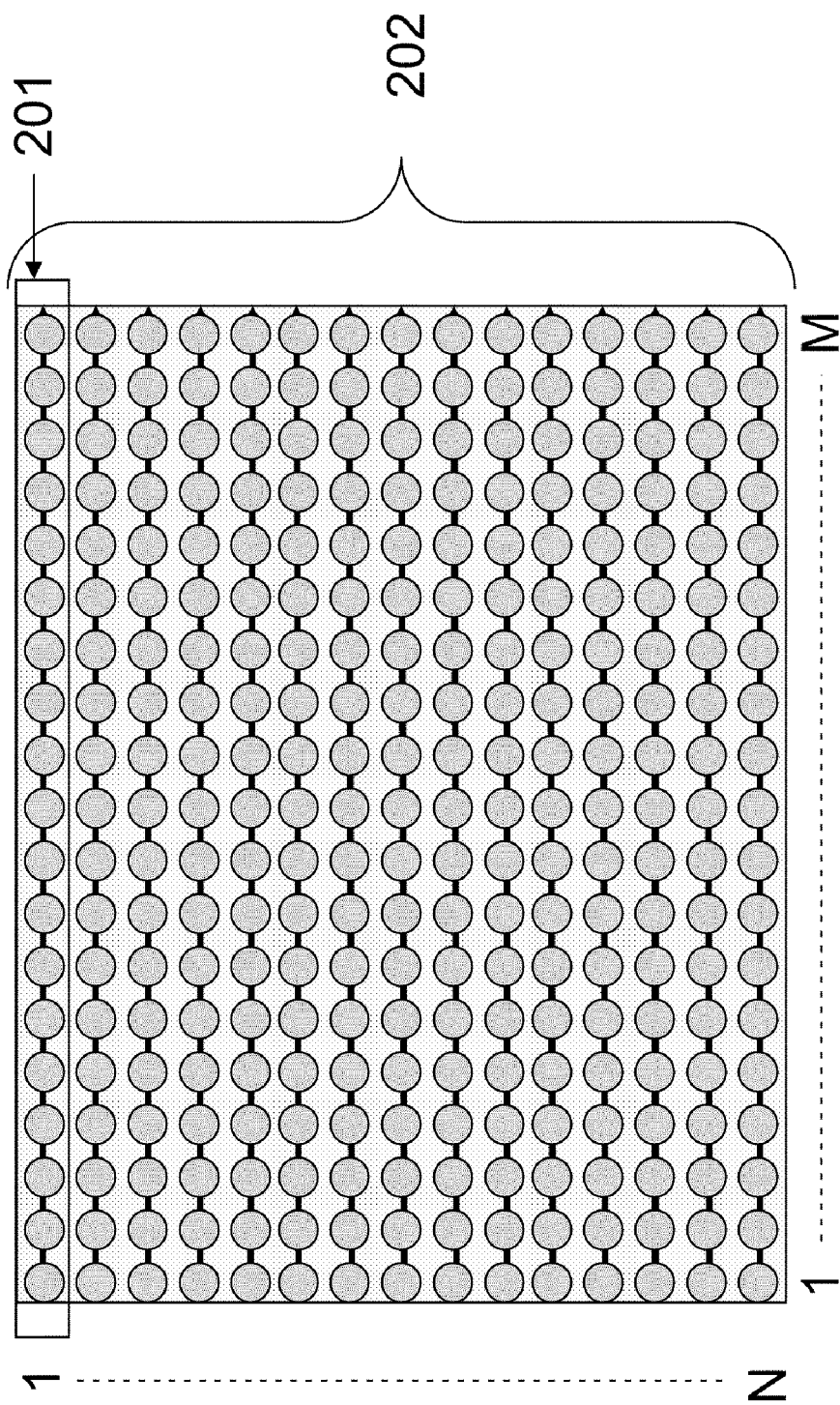
Figure 3:
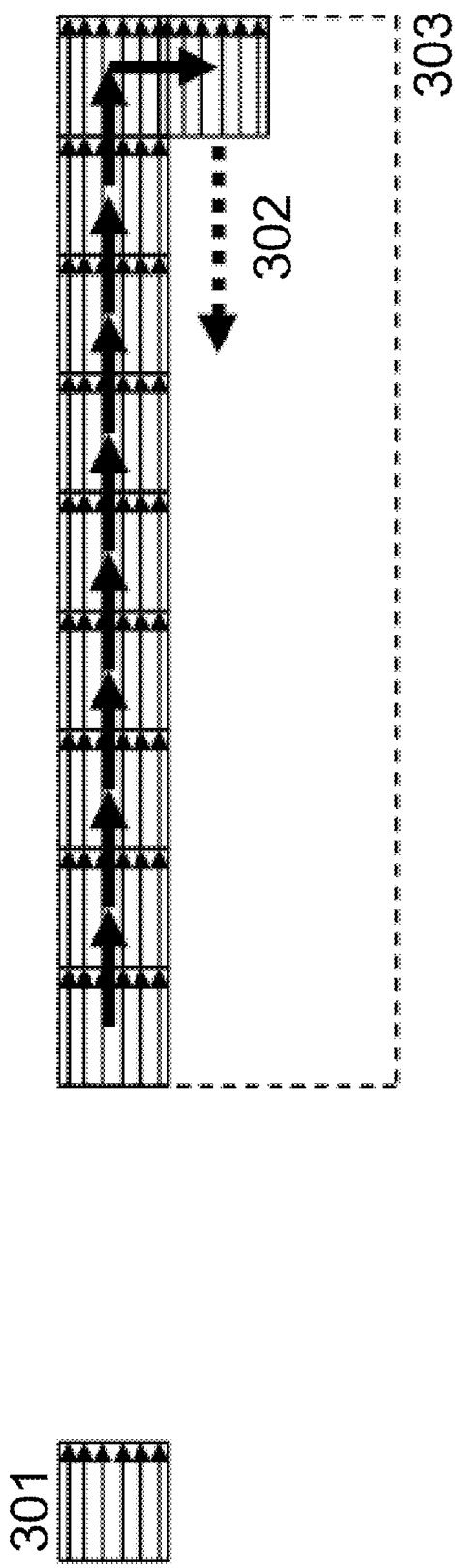
FIG. 3 illustrates a Step-and-Repeat mode imaging covering an area of interest (AOI) on a substrate in accordance with the traditional art.
Figure 17:
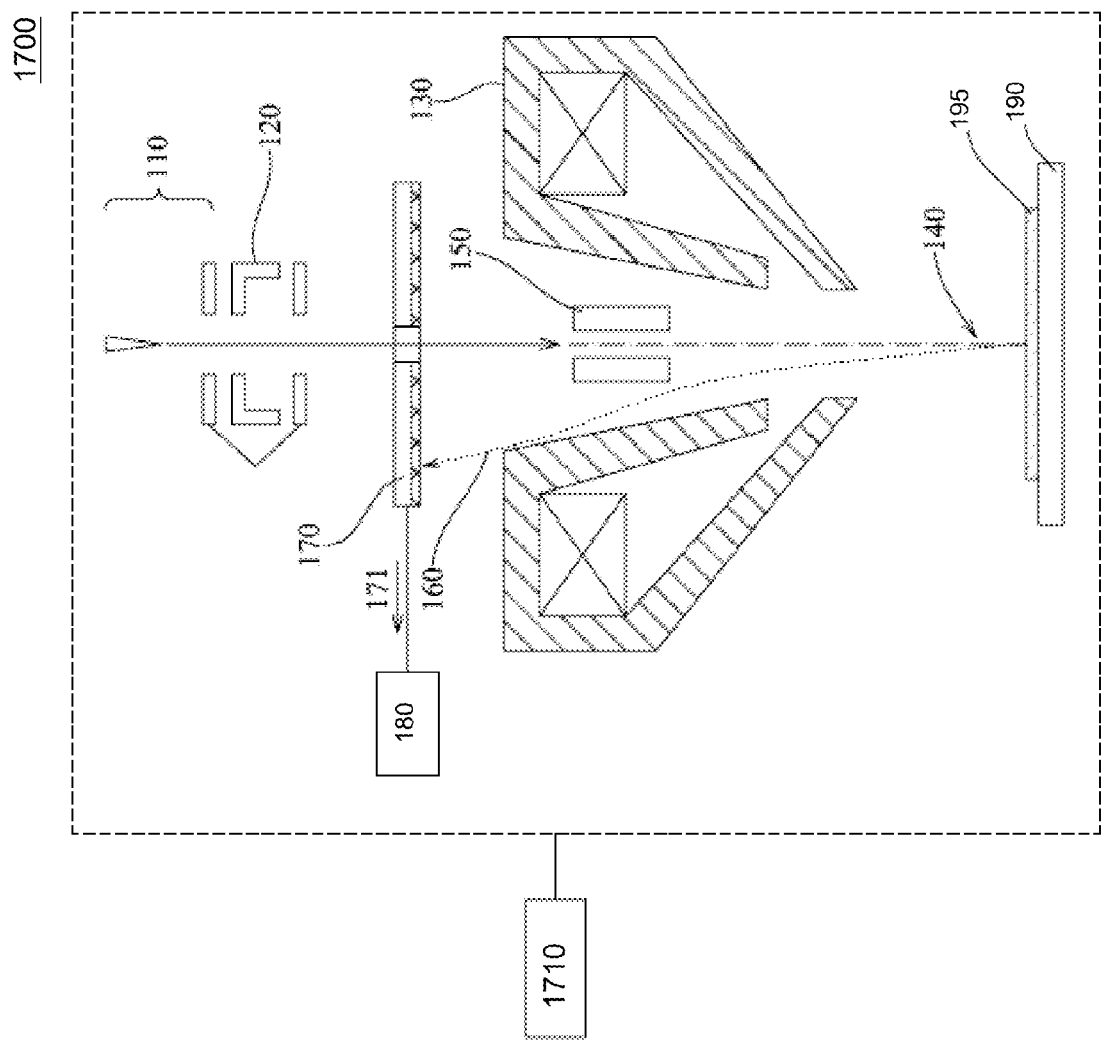
FIG. 17 illustrates a charged-particle beam imaging system in accordance with an embodiment of the present invention.

The raster-scan method described above in conjunction with reference to the accompanying figures can be implemented in a variety of ways for charged-particle beam imaging of a sample. For example, the method can be implemented in the form of a controller which is coupled to a traditional charged-particle beam microscope capable of operating in the Continuous-Scan mode, such as the microscope 100 in FIG. 1. This configuration is illustrated in FIG. 17, which shows a charged-particle beam imaging system 1700 which comprises a controller 1710 coupled to a traditional charged-particle beam microscope 100 (cf. FIG. 1). To simply the description, the charged-particle beam microscope will be referred to as comprising a charged-particle beam provider that may include a charged-particle beam source 110, a condenser lens module 120, and an objective lens module 130 for providing the focused charged-particle beam 140, a deflection module equivalent to deflection unit 150 for deflecting charged-particle beam 140 to scan across the surface of sample 195, and a moving stage equivalent to stage 190 whereupon sample 195 is secured for imaging. The stage 190 should be able to move along a fixed direction.

The controller 1710 can be implemented as a purely hardwared circuit such as an independent integrated circuit (IC), a firmware and/or a pure computing program. For example, the controller 1710 can be implemented to comprise a computer readable medium encoded with a computer program, wherein the program is able to instruct and coordinate relevant components in the charged-particle beam imaging system so as to carry out the details of the proposed method as described in the previous embodiments.

Although the present invention has been described in accordance with the embodiments shown, one of ordinary skill in the art will readily recognize that there can be variations to the embodiments and those variations would be within the spirit and scope of the present invention. Accordingly, many modifications may be made by one of ordinary skill in the art without departing from the spirit and scope of the present invention as defined by the appended claims.

What is claimed is:

1. A method of raster scanning a sample on a continuously moving stage for charged-particle beam imaging said sample, comprising:

line scanning a charged-particle beam across a surface of said sample repeatedly to form thereon at least one 2-dimensional line array composed of a plurality of scan lines lying adjacent to each other, each line array having a parallelogram shape with one of its parallel-edge pairs (or extension lines thereof) intersecting the axis of stage movement, the distance along the axis of stage movement between the intersection points being referred to as the image width, wherein when each line scan is to be performed, said charged-particle beam is shifted, along the stage-moving direction, by an extra predefined distance at least equal to a distance of said stage travel during a time period from the beginning of the first line scan of the first formed line array to the beginning of the current line scan to be performed of the current line array being formed, and wherein said at least one line array forms an image of said sample surface.

2. The method of claim 1, further comprising after said image is formed, directing said charged-particle beam to the beginning position of the first line scan of the next image to be formed.

3. The method of claim 2, wherein the moving speed of said stage is less than said image width divided by a time period from the beginning of the first line scan of the previous said image formed to the beginning of the first line scan of the next image to be formed.

4. The method of claim 2, wherein the moving speed of said stage is substantially equal to said image width divided by a time period from the beginning of the first line scan of the previous image formed to the beginning of the first line scan of the next image to be formed.

5. The method of claim 2, wherein the moving speed of said stage is greater than said image width divided by a time period from the beginning of the first line scan of the previous image formed to the beginning of the first line scan of the of the next image to be formed.

6. The method of claim 1, wherein lines of said parallel-edge pair (or extensions thereof) intersecting the axis of stage movement have a larger incident angle with the axis of stage movement than lines of the other parallel-edge pair of said parallelogram.

7. The method of claim 1, wherein the line-scan direction is parallel to the stage-moving direction.

8. The method of claim 1, wherein the line-scan direction is perpendicular to the stage-moving direction.

9. The method of claim 1, wherein the line-scan direction is at an angle with the stage-moving direction, said angle falling in a range of 0 to 180 degrees but excluding 0, 90 and 180 degrees.

10. The method of claim 1, further comprising repeatedly line scanning said charged-particle beam across a same position of line on said sample at least two times, wherein when each of said at least two line scans is to be performed, said charged-particle beam is shifted, along the stage-moving direction, by an extra predefined distance at least equal to a distance of said stage travel during a time period from the beginning of the first line scan of the first formed line array to the beginning of the current line scan to be performed of the current said line array being formed.

11. A charged-particle beam imaging system, comprising:

a charged-particle beam provider for providing a focused charged-particle beam;

a deflection module for scanning said charged-particle beam across a surface of a sample to be imaged;

a moving stage whereupon said sample is secured for imaging; and a control module coupled with said stage and said deflection module for coordinating the motion of said stage and said charged-particle beam, such that said charged-particle beam is scanned across a surface of said sample repeatedly to form thereon at least one 2-dimensional line array composed of a plurality of scan lines lying adjacent to each other, each line array having a shape of a parallelogram with lines of one of its parallel-edge pairs or extensions thereof intersecting the axis of stage movement, thereby defining a width on the axis between the intersection points, wherein when each line scan is to be performed, said charged-particle beam is shifted, along the stage-moving direction, by an extra predefined distance at least equal to one said stage traveled during a time period from the beginning of the first line scan of the first formed said line array to the beginning of the current line scan to be performed of the current said line array being formed, and wherein said at least one line array forms an image of said sample surface.

12. The charged-particle beam imaging system of claim 11, wherein after said image is formed the system is configured to direct said charged-particle beam to the beginning position of the first line scan of the next image to be formed on said sample surface.

13. The charged-particle beam imaging system of claim 12, wherein the moving speed of said stage is less than said width divided by a time period from the beginning of the first line scan of the previous said image formed to the beginning of the first line scan of the next image to be formed.

14. The charged-particle beam imaging system of claim 12, wherein the moving speed of said stage is substantially equal to said width divided by a time period from the beginning of the first line scan of the previous said image formed to the beginning of the first line scan of the next image to be formed.

15. The charged-particle beam imaging system of claim 12, wherein the moving speed of said stage is greater than said width divided by a time period from the beginning of the first line scan of the previous said image formed to the beginning of the first line scan of the next image to be formed.

16. The charged-particle beam imaging system of claim 11, wherein the lines of said parallel-edge pair intersecting the axis have a larger incident angle with the axis than do lines of the other parallel-edge pair of said parallelogram.

17. The charged-particle beam imaging system of claim 11, wherein the line-scan direction is parallel to the stage-moving direction.

18. The charged-particle beam imaging system of claim 11, wherein the line-scan direction is perpendicular to the stage-moving direction.

19. The charged-particle beam imaging system of claim 11, wherein an angle between the line-scan direction and the stage-moving direction is in a range of 0 to 180 degrees but is not equal to 0, 90 or 180 degrees.

20. The charged-particle beam imaging system of claim 11, the system being configured to repeatedly line scan, at least two times, said charged-particle beam across a same position of line on said sample, wherein when each of said at least two line scans is to be performed, the system is configured to shift said charged-particle beam along the stage-moving direction by an extra predefined distance about equal to that traveled by said stage during a time period from the beginning of the first line scan of the first formed line array to the beginning of the current line scan to be performed of the current said line array being formed.

* * * * *